(12) United States Patent
Komai

(10) Patent No.: US 12,740,169 B2
(45) Date of Patent: Sep. 15, 2026

(54) SEMICONDUCTOR CHIP AND MANUFACTURING METHOD THEREFOR, SEMICONDUCTOR DEVICE AND MANUFACTURING METHOD THEREFOR, AND ELECTRONIC DEVICE

(71) Applicant: SONY SEMICONDUCTOR SOLUTIONS CORPORATION, Kanagawa (JP)

(72) Inventor: Naoki Komai, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 394 days.

(21) Appl. No.: 18/551,169

(22) PCT Filed: Jan. 21, 2022

(86) PCT No.: PCT/JP2022/002110
§ 371 (c)(1),
(2) Date: Sep. 18, 2023

(87) PCT Pub. No.: WO2022/201815
PCT Pub. Date: Sep. 29, 2022

(65) Prior Publication Data

US 2024/0170511 A1 May 23, 2024

(30) Foreign Application Priority Data

Mar. 26, 2021 (JP) ................................ 2021-053486

(51) Int. Cl.
*H10F 39/00* (2025.01)
*H10W 72/00* (2026.01)
(Continued)

(52) U.S. Cl.
CPC ......... *H10F 39/804* (2025.01); *H10F 39/011* (2025.01); *H10F 39/8063* (2025.01);
(Continued)

(58) Field of Classification Search
CPC .. H10F 39/804; H10F 39/8063; H10F 39/011; H01L 24/16; H01L 24/32;
(Continued)

(56) References Cited

U.S. PATENT DOCUMENTS

2005/0029666 A1* 2/2005 Kurihara .............. H01L 21/563
257/772
2005/0074954 A1* 4/2005 Yamanaka .......... H10F 39/1532
257/E27.155
(Continued)

FOREIGN PATENT DOCUMENTS

JP 2002-141444 5/2002
JP 2010-251563 11/2010
(Continued)

OTHER PUBLICATIONS ip.com search (Year: 2026).*
International Search Report and Written Opinion prepared by the Japan Patent Office on Apr. 4, 2022, for International Application No. PCT/JP2022/002110, 2 pgs.

*Primary Examiner* — Zandra V Smith
*Assistant Examiner* — Andre C Stevenson
(74) *Attorney, Agent, or Firm* — SHERIDAN ROSS P.C.

(57) ABSTRACT

The present technology relates to a semiconductor chip of an imaging element, a method of manufacturing the semiconductor chip, a semiconductor device, a method of manufacturing the semiconductor device, and an electronic device, which are capable of suppressing image quality deterioration of a captured image while securing long-term reliability after mounting of the substrate. The semiconductor chip includes a CMOS image sensor, a sealing resin formed on the CMOS image sensor, and a protective substrate bonded to the CMOS image sensor via the sealing resin. The sealing resin includes a base material and a reinforcing material having a Young's modulus or breaking strength higher than that of the base material. The present technology can be
(Continued)

applied to, for example, a semiconductor chip of a CMOS image sensor or the like.

20 Claims, 17 Drawing Sheets

(51) Int. Cl.
*H10W 74/15* (2026.01)
*H10W 90/00* (2026.01)

(52) U.S. Cl.
CPC ........ *H10W 72/072* (2026.01); *H10W 72/073* (2026.01); *H10W 74/15* (2026.01); *H10W 90/724* (2026.01); *H10W 90/734* (2026.01)

(58) Field of Classification Search
CPC ..................... H01L 24/73; H01L 24/92; H01L 2224/16227; H01L 2224/32225; H01L 2224/73204; H01L 2224/92125
See application file for complete search history.

(56) References Cited

U.S. PATENT DOCUMENTS

| | | | | |
|---|---|---|---|---|
| 2008/0042227 | A1 | 2/2008 | Asano et al. | |
| 2018/0006070 | A1 | 1/2018 | Isobe | |
| 2018/0061879 | A1 | 3/2018 | Kurihara et al. | |
| 2021/0005656 | A1* | 1/2021 | Shibayama | H10F 39/8063 |
| 2021/0013256 | A1 | 1/2021 | Lin et al. | |
| 2022/0173174 | A1* | 6/2022 | Hatsumi | G09G 3/3208 |

FOREIGN PATENT DOCUMENTS

| | | |
|---|---|---|
| JP | 2018-016757 | 2/2018 |
| JP | 2018-032792 | 3/2018 |
| JP | 2019-195051 | 11/2019 |
| WO | WO 2006/073085 | 7/2006 |
| WO | WO 2016/129409 | 8/2016 |

* cited by examiner

Figure 2:
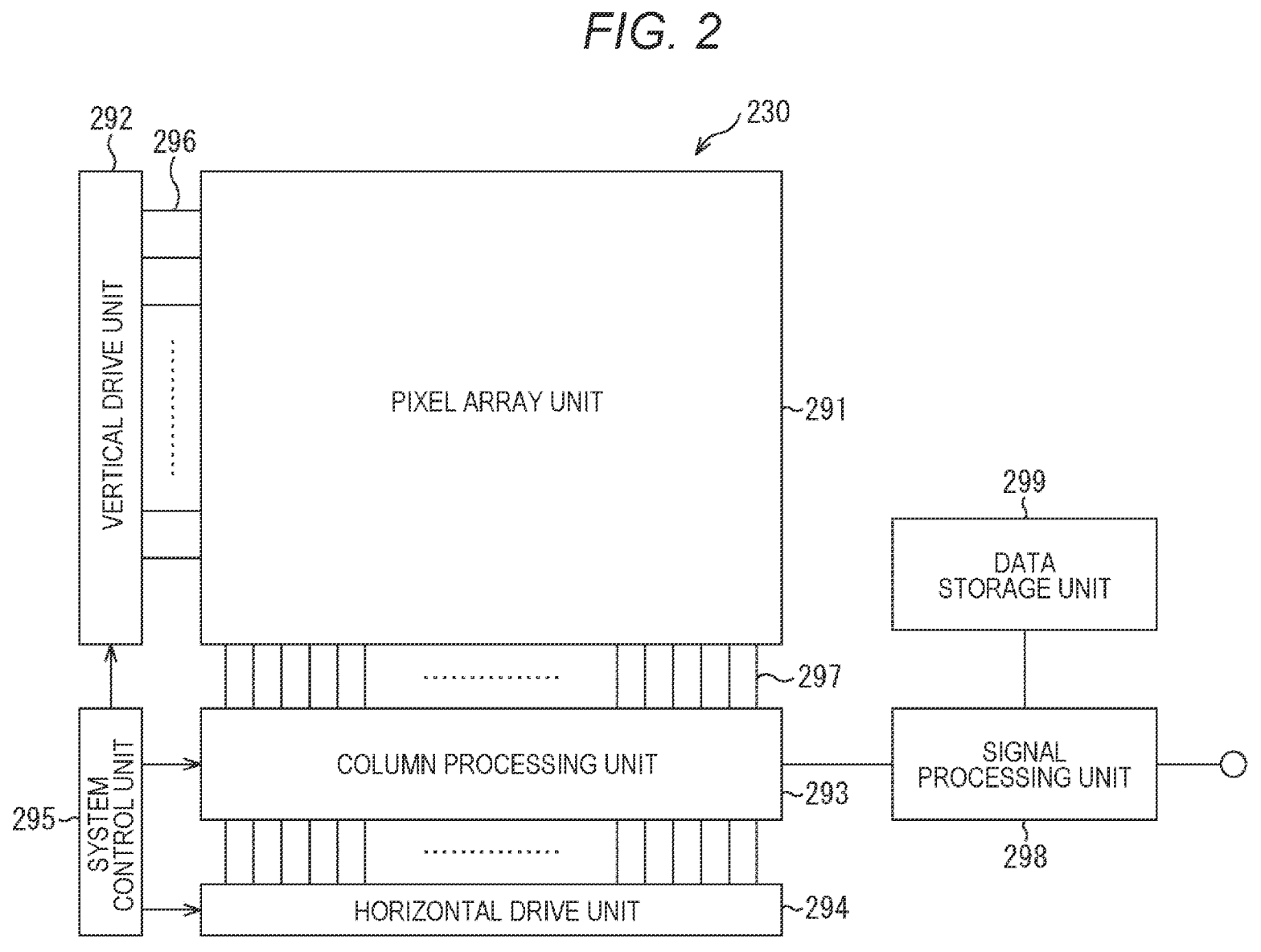

PIXEL ARRAY UNIT 291

VERTICAL DRIVE UNIT 292

296

297

COLUMN PROCESSING UNIT 293

HORIZONTAL DRIVE UNIT 294

SYSTEM CONTROL UNIT 295

SIGNAL PROCESSING UNIT 298

DATA STORAGE UNIT 299

SEMICONDUCTOR CHIP AND MANUFACTURING METHOD THEREFOR, SEMICONDUCTOR DEVICE AND MANUFACTURING METHOD THEREFOR, AND ELECTRONIC DEVICE

CROSS REFERENCE TO RELATED APPLICATIONS

This application is a national stage application under 35 U.S.C. 371 and claims the benefit of PCT Application No. PCT/JP2022/002110, having an international filing date of 21 Jan. 2022, which designated the United States, which PCT application claimed the benefit of Japanese Patent Application No. 2021-053486, filed 26 Mar. 2021, the entire disclosures of each of which are incorporated herein by reference.

TECHNICAL FIELD

The present technology relates to a semiconductor chip and a method of manufacturing the same, a semiconductor device and a method of manufacturing the same, and an electronic device, and more particularly, to a semiconductor chip of an imaging element, a method of manufacturing the same, a semiconductor device and a method of manufacturing the same, and an electronic device capable of suppressing image quality deterioration of a captured image while securing long-term reliability after mounting of the substrate in the semiconductor chip.

BACKGROUND ART

In a semiconductor chip of a solid-state imaging element such as a complementary metal oxide semiconductor (CMOS) image sensor, it has been proposed that a glass substrate for protecting a light receiving unit is formed on the light receiving unit via an acrylic resin having high transparency and adhesiveness (see, for example, Patent Document 1).

In addition, technology has been proposed in which the refractive index of the material of the functional film formed between the microlens array formed on the photoelectric conversion unit of the image sensor and the light transmission plate is made lower than the refractive index of the material of the microlens array to improve the light condensing property of the microlens (see, for example, Patent Document 2). In the invention described in Patent Document 2, the density is reduced by forming a steric hindrance using a filler material whose main component is silicon dioxide in the functional film, and a low refractive index is realized.

Meanwhile, when a semiconductor chip is flip-chip mounted, it has been proposed to improve reliability by filling a gap between the semiconductor chip and a substrate with a sealing resin and covering a side end surface of the semiconductor chip with an elastic body (see, for example, Patent Document 3).

CITATION LIST

Patent Document

Patent Document 1: Japanese Patent Application Laid-Open No. 2018-16757

Patent Document 2: Japanese Patent Application Laid-Open No. 2019-195051

Patent Document 3: Japanese Patent Application Laid-Open No. 2002-141444

SUMMARY OF THE INVENTION

Problems to be Solved by the Invention

When a semiconductor chip of a solid-state imaging element is increased in added value such as an increase in the number of pixels, the semiconductor chip is increased in size, and it is difficult to secure long-term reliability after mounting the substrate. Therefore, in this case, for example, it is conceivable to secure long-term reliability after mounting the substrate by filling the gap between the semiconductor chip and the substrate with the underfill material (sealing resin).

However, in a case where a protective substrate is formed on a solid-state imaging element via a sealing resin in a semiconductor chip, and the sealing resin is, for example, an acrylic polymer, a curing shrinkage stress when the underfill material is cured (thermally cured) may cause cohesive fracture of the sealing resin in contact with the underfill material, leading to whitening. When the whitening reaches the pixel region (light receiving region) of the solid-state imaging element, the light is irregularly reflected at the whitened portion, so that image quality deterioration of the captured image and the like occur.

Therefore, in the semiconductor chip of the solid-state imaging element, it is difficult to suppress image quality deterioration of the captured image while securing long-term reliability after mounting the substrate.

The present technology has been made in view of such a situation, and an object thereof is to suppress image quality deterioration of a captured image while securing long-term reliability after mounting of a substrate in a semiconductor chip of an imaging element.

Solutions to Problems

A semiconductor chip according to a first aspect of the present technology includes: an imaging element; a sealing resin formed on the imaging element; and a protective substrate bonded to the imaging element via the sealing resin, in which the sealing resin includes a base material and a reinforcing material having a Young's modulus or breaking strength higher than that of the base material.

A method of manufacturing a semiconductor chip according to a second aspect of the present technology includes: forming an imaging element; forming a sealing resin including a base material and a reinforcing material having a Young's modulus or breaking strength higher than that of the base material on the imaging element; and bonding a protective substrate to the imaging element via the sealing resin.

A semiconductor device according to a third aspect of the present technology includes: a semiconductor chip including: an imaging element; a sealing resin formed on the imaging element; and a protective substrate bonded to the imaging element via the sealing resin, the sealing resin including a base material and a reinforcing material having a Young's modulus or breaking strength higher than that of the base material; a substrate on which the semiconductor chip is mounted; and an underfill material formed on the substrate to cover a side surface of the semiconductor chip.

A method of manufacturing a semiconductor device according to a fourth aspect of the present technology includes: forming a semiconductor chip by: forming an imaging element; forming a sealing resin including a base material and a reinforcing material having a Young's modulus or breaking strength higher than that of the base material on the imaging element; and bonding a protective substrate to the imaging element via the sealing resin; mounting the semiconductor chip on a substrate; and charging an underfill material from a periphery of the semiconductor chip between the semiconductor chip and the substrate and thermally curing the underfill material, and covering a side surface of the semiconductor chip with the underfill material.

A semiconductor device according to a fifth aspect of the present technology includes: a semiconductor chip including: an imaging element; a sealing resin formed on the imaging element; and a protective substrate bonded to the imaging element via the sealing resin, the sealing resin including a base material and a reinforcing material having a Young's modulus or breaking strength higher than that of the base material; a substrate on which the semiconductor chip is mounted using a wire; and a resin formed on the substrate to cover the wire on a side surface of the semiconductor chip.

An electronic device according to a sixth aspect of the present technology includes: a semiconductor chip including: an imaging element; a sealing resin formed on the imaging element; and a protective substrate bonded to the imaging element via the sealing resin, the sealing resin including a base material and a reinforcing material having a Young's modulus or breaking strength higher than that of the base material; and a signal processing circuit that processes a signal from the semiconductor chip.

In the first aspect of the present technology, an imaging element, a sealing resin formed on the imaging element, and a protective substrate bonded to the imaging element via the sealing resin are provided, and the sealing resin includes a base material and a reinforcing material having a Young's modulus or breaking strength higher than that of the base material.

In the second aspect of the present technology, an imaging element is formed, a sealing resin including a base material and a reinforcing material having a Young's modulus or breaking strength higher than that of the base material is formed on the imaging element, and a protective substrate is bonded to the imaging element via the sealing resin.

In the third aspect of the present technology, there are provided: a semiconductor chip including: an imaging element; a sealing resin formed on the imaging element; and a protective substrate bonded to the imaging element via the sealing resin, the sealing resin including a base material and a reinforcing material having a Young's modulus or breaking strength higher than that of the base material; a substrate on which the semiconductor chip is mounted; and an underfill material formed on the substrate to cover a side surface of the semiconductor chip.

In the fourth aspect of the present technology, an imaging element is formed, a sealing resin containing a base material and a reinforcing material having a Young's modulus or breaking strength higher than that of the base material is formed on the imaging element, a semiconductor chip is formed by bonding a protective substrate to the imaging element via the sealing resin, the semiconductor chip is mounted on a substrate, a space between the semiconductor chip and the substrate is filled with an underfill material from a periphery of the semiconductor chip and thermally cured, and a side surface of the semiconductor chip is covered with the underfill material.

In the fifth aspect of the present technology, there are provided: a semiconductor chip including: an imaging element; a sealing resin formed on the imaging element; and a protective substrate bonded to the imaging element via the sealing resin, the sealing resin including a base material and a reinforcing material having a Young's modulus or breaking strength higher than that of the base material; a substrate on which the semiconductor chip is mounted using a wire; and a resin formed on the substrate to cover the wire on a side surface of the semiconductor chip.

In the sixth aspect of the present technology, there are provided: a semiconductor chip including: an imaging element; a sealing resin formed on the imaging element; and a protective substrate bonded to the imaging element via the sealing resin, the sealing resin including a base material and a reinforcing material having a Young's modulus or breaking strength higher than that of the base material; and a signal processing circuit that processes a signal from the semiconductor chip.

The semiconductor chip, the semiconductor device, and the electronic device may be independent devices, or may be modules incorporated in other devices.

BRIEF DESCRIPTION OF DRAWINGS

FIG. 1 is a diagram illustrating an example of a package structure of a first embodiment of a semiconductor device to which the present technology is applied.

FIG. 2 is a diagram illustrating a circuit configuration of a CMOS image sensor in FIG. 1.

FIG. 3 is a diagram illustrating an example of a semiconductor device provided with a general sealing resin.

MODE FOR CARRYING OUT THE INVENTION

Figure 4:
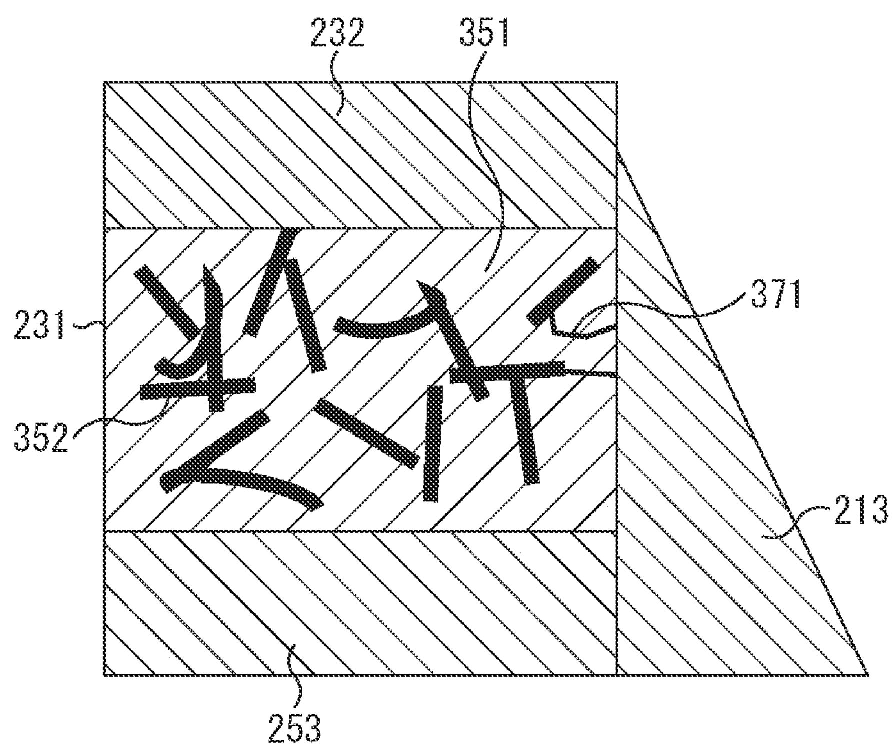
FIG. 4 is an enlarged view of a rectangle of FIG. 1.

Hereinafter, modes for carrying out the present technology (hereinafter, referred to as embodiments) will be described. Note that the description will be made in the following order.

1. First Embodiment of Semiconductor Device
2. Second Embodiment of Semiconductor Device
3. Application Example to Electronic Device
4. Use Example of Semiconductor Chip
5. Application Example to Endoscopic Surgery System
6. Application Example to Moving Body Note that in the drawings referred to in the following description, the same or similar portions are denoted by the same or similar reference numerals. However, the drawings are schematic, and the relationship between the thickness and the plane dimension, the ratio of the thickness of each layer, and the like are different from the actual ones. Furthermore, the drawings may include portions having different dimensional relationships and ratios.

Furthermore, definitions of directions such as up and down in the following description are merely definitions for convenience of description, and do not limit the technical idea of the present disclosure. For example, when an object is observed by rotating the object by 90°, the upper and lower sides are read by converting into left and right, and when an object is observed by rotating the object by 180°, the upper and lower sides are read by inverting.

1. First Embodiment of Semiconductor Device

<Package Structure of Semiconductor Device>

Figure 1:
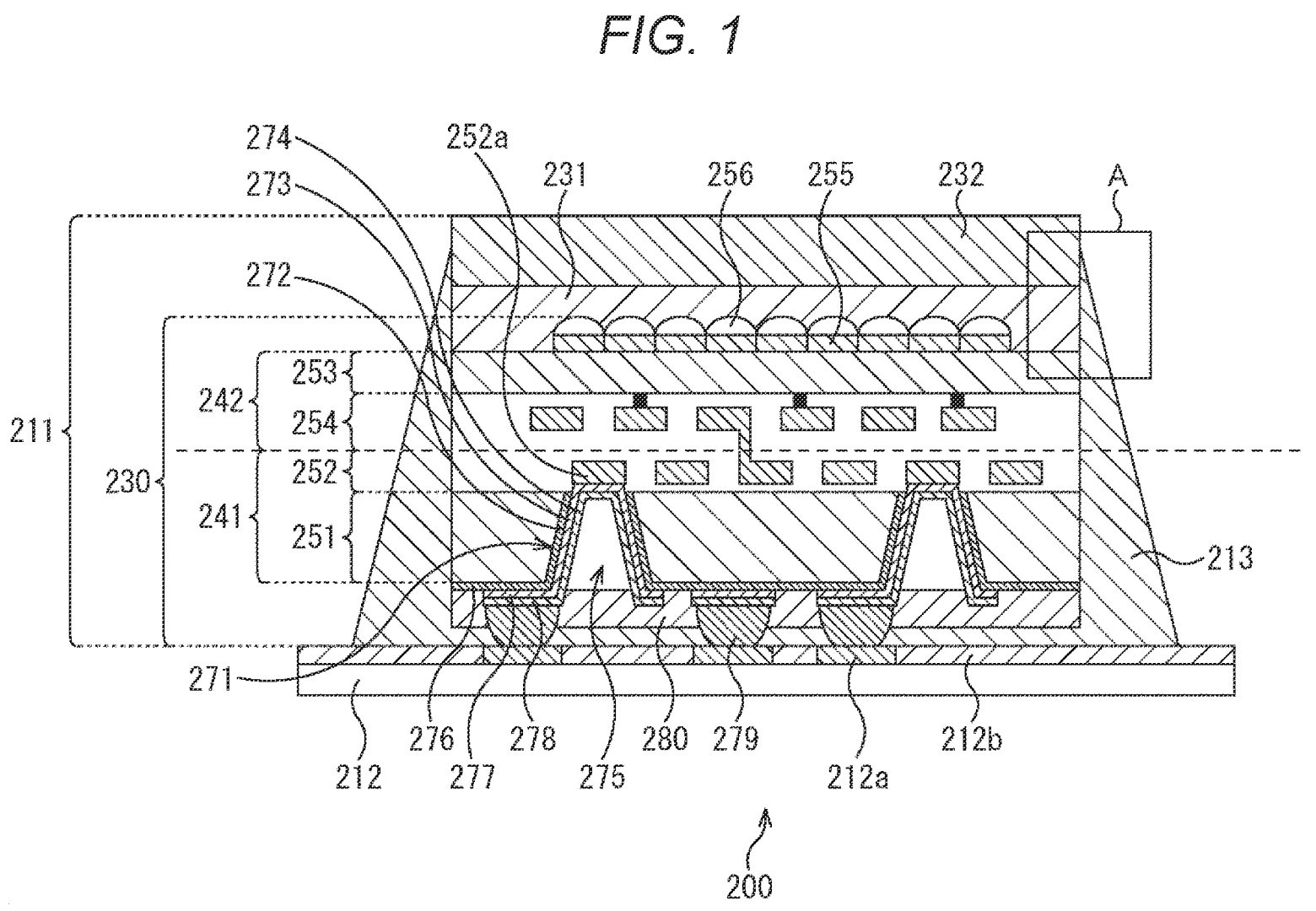

FIG. 1 is a diagram illustrating an example of a package structure of a first embodiment of a semiconductor device to which the present technology is applied.

A semiconductor device 200 in FIG. 1 is configured by mounting a semiconductor chip 211 on a substrate 212. Specifically, a conductor 212*a* and the like are formed at predetermined positions on the surface of the substrate 212, and a photosensitive solder resist 212*b* is formed in the other region. A solder ball 279 formed on the lower side of the semiconductor chip 211 is mounted on the conductor 212*a*, thereby configuring the semiconductor device 200.

An underfill material 213 is charged between the semiconductor chip 211 and the substrate 212 from the periphery of the semiconductor chip 211. That is, the underfill material 213 is formed on the substrate 212 so as to cover the bottom surface and the side surface of the semiconductor chip 211.

The semiconductor chip 211 is a cavityless chip size package (CSP) in which a transparent protective substrate 232 is formed on a CMOS image sensor 230 as a solid-state imaging element via a sealing resin 231. Specifically, the sealing resin 231 is formed on an upper side (a side on which light is incident) of the CMOS image sensor 230. In addition, the protective substrate 232 is, for example, a glass substrate, and is bonded to the CMOS image sensor 230 via the sealing resin 231. Although details of the sealing resin 231 will be described later, the sealing resin 231 includes a base material and a reinforcing material having a Young's modulus or breaking strength higher than that of the base material.

As described above, since the semiconductor chip 211 is a cavityless CSP having no space in which the sealing resin 231 is charged between the CMOS image sensor 230 and the protective substrate 232, it is possible to reduce the height and size of the semiconductor chip.

The CMOS image sensor 230 is a stacked back-illuminated CMOS image sensor. Specifically, the CMOS image sensor 230 is configured by stacking an upper substrate 242 on a lower substrate 241.

The lower substrate 241 is configured by forming a wiring layer 252 on a support substrate 251 such as a silicon substrate.

A through hole 271 penetrating the support substrate 251 is formed in a region of the support substrate 251 corresponding to a connection pad 252*a* of the wiring layer 252. A connection conductor 274 is embedded in an inner wall of the through hole 271 via an insulating film 272 and a barrier seed layer 273, thereby forming a through silicon via (TSV) 275. The connection conductor 274 of the through silicon via 275 is connected to a redistribution layer 278 formed on the lower surface side of the support substrate 251 via an insulating film 276 and a barrier seed layer 277.

The solder ball 279 is formed at a predetermined position of the redistribution layer 278. The CMOS image sensor 230 and the substrate 212 are electrically connected via the solder ball 279. That is, the semiconductor chip 211 is a ball grid array (BGA) package. On the lower surface side of the support substrate 251, a photosensitive solder resist 280 is formed so as to cover the insulating film 276 and the redistribution layer 278 except for the region where the solder ball 279 is formed.

In the wiring layer 252, a logic F circuit such as a control circuit that controls a pixel (not illustrated) that is formed on the upper substrate 242 and performs photoelectric conversion and a signal processing circuit that processes a pixel signal output from the pixel is formed.

Meanwhile, the upper substrate 242 is configured by forming a wiring layer 254 on the lower side of a silicon substrate 253. On the surface of the silicon substrate 253, a plurality of photodiodes (not illustrated) is formed at predetermined intervals as photoelectric conversion units of the respective pixels.

Although not illustrated in order to simplify the drawing, a protective film constituted by $SiO_2$ is actually formed on the silicon substrate 253 and the photodiode. A light shielding film for preventing leakage of light to an adjacent pixel is formed between adjacent photodiodes on the protective film. A planarizing film for planarizing a region where a color filter 255 to be described later is formed is formed on the protective film and the light shielding film. Details of this structure are described, for example, in WO 2014/148276. As described above, the protective film, the light shielding film, the planarizing film, and the like are formed on the silicon substrate 253, and hereinafter, these are appropriately collectively referred to as a silicon substrate 253.

A color filter 255 is formed on (the planarizing film of) the silicon substrate 253. The color filter 255 is provided for each pixel, and the color array of the color filter 255 of each pixel is, for example, a Bayer array. On the color filter 255, an on-chip lens (microlens) 256 for collecting light to the photodiode of each pixel and improving the sensitivity of the photodiode is formed.

The on-chip lens 256 is constituted by an inorganic material such as SiN, SiO, or SiOxNy (x and y are values larger than 0 and equal to or smaller than 1). Here, the semiconductor chip 211 is a cavityless CSP, and the sealing resin 231 exists on the on-chip lens 256 instead of a space. Therefore, when the refractive index of the on-chip lens 256 is higher than the refractive index of the sealing resin 231, the light condensing property of the on-chip lens 256 is improved. Therefore, it is desirable to use SiN having a high refractive index among SiN, SiO, SiOxNy, and the like as the material of the on-chip lens 256.

The wiring layer 254 forms a circuit of a pixel. By bonding the wiring layer 254 to the wiring layer 252, the upper substrate 242 is stacked on the lower substrate 241.

<Circuit Configuration of CMOS Image Sensor>

FIG. 2 is a diagram illustrating a circuit configuration of the CMOS image sensor 230 in FIG. 1.

As illustrated in FIG. 2, the CMOS image sensor 230 includes a pixel array unit 291 and a control circuit including a vertical drive unit 292, a column processing unit 293, a horizontal drive unit 294, a system control unit 295, and the like. The CMOS image sensor 230 also includes logic circuits such as a signal processing unit 298 and a data storage unit 299.

The pixel array unit 291 has a configuration in which pixels (not illustrated) each including a photodiode or the like that performs photoelectric conversion on received light and accumulates electric charge according to the amount of received light are two-dimensionally arranged in a row direction (horizontal direction) and a column direction (vertical direction), that is, in a matrix.

In the pixel array unit 291, the pixel drive line 296 is wired along the row direction for each row of pixels, and the vertical signal line 297 is wired along the column direction for each column of pixels. The pixel drive line 296 transmits a drive signal for performing driving when reading a signal from a pixel. In FIG. 2, the pixel drive line 296 is illustrated as one wiring, but is not limited to one. One end of the pixel drive line 296 is connected to an output terminal corresponding to each row of the vertical drive unit 292.

The vertical drive unit 292 includes a shift register, an address decoder, and the like, and drives all the pixels of the pixel array unit 291 at the same time or in units of rows. Although a specific configuration of the vertical drive unit 292 is not illustrated, it generally includes two scanning systems of a read scanning system and a sweep scanning system.

The read scanning system sequentially selectively scans the pixels of the pixel array unit 291 row by row in order to read signals from the pixels. The pixel signal that is a signal read from the pixel is an analog signal. The sweep scanning system performs sweep scanning before the read scanning by a time corresponding to a shutter speed on the row being read on which the read scanning is performed by the read scanning system. By this sweep scanning, an electronic shutter operation of sweeping unnecessary charges from the photoelectric conversion units of the pixels in the read row, resetting the photoelectric conversion units, and starting accumulation of charges is performed.

The pixel signal read by the read operation by the read scanning system corresponds to the amount of light received after the immediately preceding read operation or electronic shutter operation. Then, the period from the read timing by the immediately preceding read operation or the sweep timing by the electronic shutter operation to the read timing by the current read operation is the charge accumulation period (exposure period) in the pixel.

The pixel signal read from each pixel of the read row is input to the column processing unit 293 through each vertical signal line 297 for each column of pixels. The column processing unit 293 includes a signal processing circuit for each column of pixels of the pixel array unit 291. Each signal processing circuit of the column processing unit 293 performs predetermined signal processing on the pixel signal input from the pixel of the corresponding column through the vertical signal line 297, and temporarily holds the pixel signal after the signal processing.

Specifically, each signal processing circuit of the column processing unit 293 performs noise removal processing such as correlated double sampling (CDS) processing as predetermined signal processing. Through this CDS processing, fixed pattern noise unique to the pixel such as reset noise and threshold variation of the amplification transistor in the pixel is removed. The column processing unit 293 also performs analog/digital (A/D) conversion processing as predetermined signal processing to convert an analog pixel signal into a digital signal.

The horizontal drive unit 294 includes a shift register, an address decoder, and the like, and sequentially selects each signal processing circuit of the column processing unit 293. By the selective scanning by the horizontal drive unit 294, signal processing is performed in each signal processing circuit of the column processing unit 293, and the held pixel signals are sequentially output.

The system control unit 295 includes a timing generator that generates various timing signals and the like. The system control unit 295 controls the vertical drive unit 292, the column processing unit 293, the horizontal drive unit 294, and the like on the basis of various timings generated by the timing generator.

The signal processing unit 298 has at least an arithmetic processing function, and performs various signal processing such as arithmetic processing on a pixel signal that is a digital signal output from the column processing unit 293. The data storage unit 299 temporarily stores data necessary for signal processing in the signal processing unit 298.

<Description of Sealing Resin>

Next, the sealing resin 231 of FIG. 1 will be described with reference to FIGS. 3 to 5.

Figure 3:
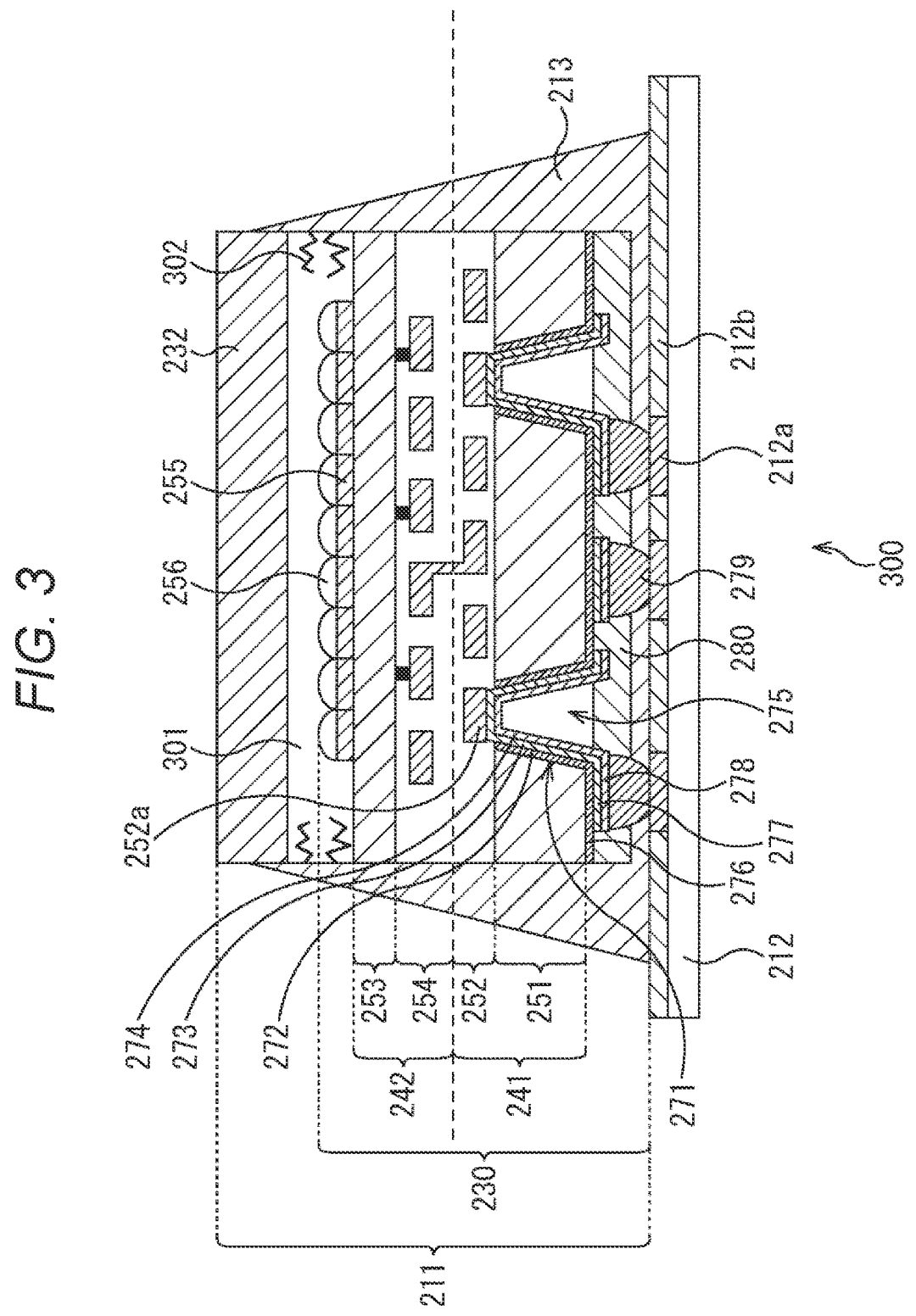

FIG. 3 is a diagram illustrating an example of a semiconductor device in which a general sealing resin not containing a reinforcing material is provided instead of the sealing resin 231 in the semiconductor device 200 of FIG. 1.

In FIG. 3, portions corresponding to those in FIG. 1 are denoted by the same reference numerals, and detailed description of the portions is omitted.

As illustrated in FIG. 3, the semiconductor device 300 is different from the semiconductor device 200 in FIG. 1 in that a general sealing resin 301 using an acrylic polymer not containing a reinforcing material is provided instead of the sealing resin 231.

In such a semiconductor device 300, due to the curing shrinkage stress when the underfill material 213 is thermally cured, cohesive fracture (cohesive rupture) may occur in the sealing resin 301 in contact with the underfill material 213, and a crack 302 may occur. When whitening of the sealing resin 301 due to the crack 302 reaches the periphery of the on-chip lens 256, light is diffusely reflected at the whitened portion, and the image quality of the captured image is deteriorated.

Furthermore, there is a case where light reflected by the on-chip lens 256 or the surface of the silicon substrate 253 is totally reflected by the upper surface (surface) of the protective substrate 232, and is re-incident on a light receiving region which is a region where a photodiode of the silicon substrate 253 is formed. In this case, a diffraction ghost or a diffraction flare having periodicity may occur in the captured image.

For example, in a case where the sealing resin 301 and the protective substrate 232 have substantially the same refractive index, light reflected by the surface of the on-chip lens 256 or the silicon substrate 253 travels straight to the surface of the protective substrate 232 away from the surface. Therefore, a strong diffraction ghost may occur at a position away from the reflection position of the surface of the on-chip lens 256 or the silicon substrate 253 due to the light totally reflected by the protective substrate 232. Such a diffraction ghost or a diffraction flare is not desired because it is an unintended reflection of light, that is, noise.

FIG. 4 is an enlarged view of a rectangle A in FIG. 1.

As illustrated in FIG. 4, in the semiconductor device 200 of FIG. 1, the sealing resin 231 is constituted by a base material 351 and a reinforcing material 352. That is, the sealing resin 231 has a composite structure in which the reinforcing material 352 having a Young's modulus or breaking strength higher than that of the base material 351 is randomly dispersed.

As described above, since the sealing resin 231 contains the reinforcing material 352, the sealing resin 231 can be reinforced as compared with the sealing resin 301. Therefore, it is possible to suppress the cohesive fracture of the sealing resin 231 due to the curing shrinkage stress when the underfill material 213 is thermally cured. As a result, the occurrence of whitening of the sealing resin 231 is reduced, and image quality deterioration of the captured image due to this whitening is suppressed.

In addition, even in a case where the crack 371 is generated by the cohesive fracture, the crack 371 can be stopped at the interface of the reinforcing material 352. Therefore, it is possible to prevent the crack 371 from developing around the on-chip lens 256, that is, on the light receiving region. As a result, it is possible to suppress an adverse effect on the image quality of the captured image due to whitening of the sealing resin 231.

As described above, in the semiconductor device 200, it is possible to suppress image quality deterioration of a captured image due to whitening of the sealing resin 231 while securing long-term reliability after the semiconductor chip 211 is protected by the underfill material 213 and the semiconductor chip 211 is mounted on the substrate 212.

The sealing resin 231 is configured such that, for example, an average transmittance in a wavelength region of visible light (for example, 400 nm to 700 nm) is 98.5% or more. The base material 351 is an acrylic sealing resin having a refractive index lower than the refractive index of the on-chip lens 256 and substantially equal to the refractive index of the protective substrate 232. For example, in a case where the protective substrate 232 is a glass substrate having a refractive index of 1.51, for example, an acrylic resin having a refractive index of 1.5 is used as the base material 351.

As described above, in the sealing resin 231, since the refractive index of the base material 351 is lower than the refractive index of the on-chip lens 256, the light condensing property of the on-chip lens 256 can be improved. In addition, since the protective substrate 232 and the base material 351 have substantially the same refractive index, it is possible to suppress the influence of the base material 351 on the light incident on the light receiving region through the protective substrate 232.

The reinforcing material 352 is a fibrous material that transmits visible light. Examples of such a material include glass fibers, cellulose nanofibers, and organic fibers such as nanoparticle aggregates of nanoparticles having a particle diameter of 100 nm or less. Cellulose nanofibers are transparent cellulose fibers formed by hydrolyzing and pulverizing wood or the like and thinned to the nano level. The cellulose nanofibers have, for example, five times the strength of steel.

The diameter of the cross section of the short side of the reinforcing material 352 is shorter than the wavelength of visible light, and the diameter of the cross section of the long side is three times or more the diameter of the cross section of the short side, that is, the aspect ratio is three or more. As a result, it is possible to suppress the influence of the reinforcing material 352 on the light incident on the light receiving region through the protective substrate 232.

The refractive index of the reinforcing material 352 is substantially equal to the refractive index of the base material 351. Specifically, the difference in refractive index between the reinforcing material 352 and the base material 351 is desirably, for example, 0.03 or more and 0.06 or less. In a case where the difference in refractive index between the reinforcing material 352 and the base material 351 is 0.06 or less, the influence of the reinforcing material 352 on the light incident on the light receiving region through the protective substrate 232 can be suppressed. As a result, image quality deterioration due to the reinforcing material 352 can be suppressed.

Figure 5:
FIG. 5 is a diagram illustrating refraction of light in a sealing resin.

In addition, in a case where the difference in refractive index between the reinforcing material 352 and the base material 351 is 0.03 or more, as illustrated in FIG. 5, the light incident on the sealing resin 231 is refracted, and (the optical axis of) the light changes in various directions. As a result, it is possible to suppress the occurrence of the phase shift of the light reflected by the light receiving region or the on-chip lens 256, incident on the protective substrate 232 via the sealing resin 231, totally reflected by the upper surface of the protective substrate 232, and re-incident on the light receiving region via the sealing resin 231 or the like. As a result, it is possible to reduce the occurrence of diffraction ghost (brightness of light) and diffraction flare in the captured image due to the phase shift. Thus, the image quality of the captured image can be improved.

The reinforcing material 352 is dispersed at a ratio of 2 to 50 wt % with respect to the base material 351. As a result, it is possible to suppress a decrease in the resolution of the captured image due to the density of the reinforcing material 352.

<Method of Manufacturing Semiconductor Device>

FIGS. 6 to 10 are diagrams for explaining a method of manufacturing the semiconductor device 200 in FIG. 1.

Figure 6:
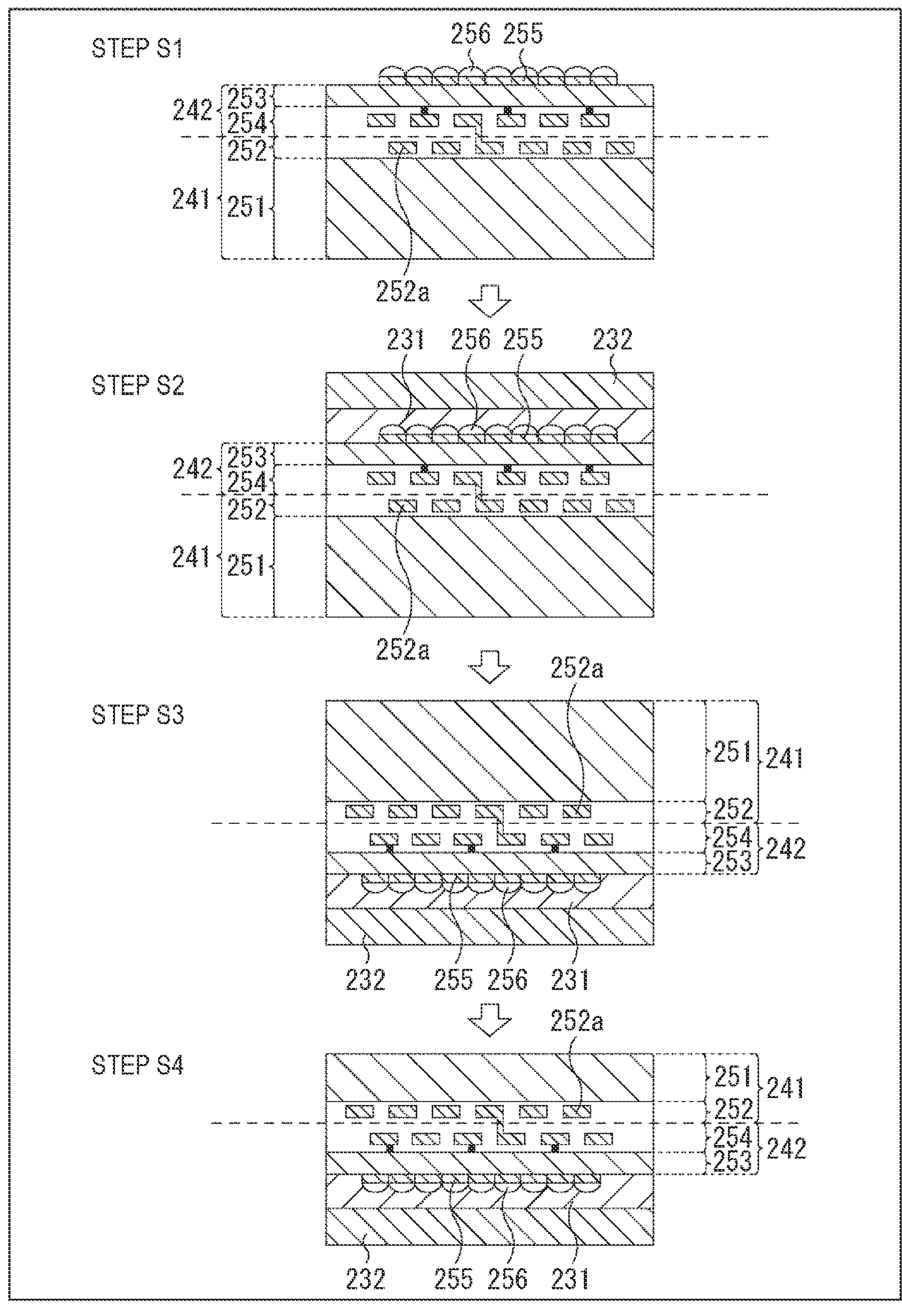
FIG. 6 is a diagram for explaining a method of manufacturing the semiconductor device in FIG. 1.

In step S1 of FIG. 6, the CMOS image sensor 230 in which the through silicon via 275, the insulating film 276, the barrier seed layer 277, the redistribution layer 278, the solder ball 279, and the photosensitive solder resist 280 are not formed is formed. Specifically, the lower substrate 241 on which nothing is formed on the support substrate 251 is stacked with the upper substrate 242 on which the color filters 255 and the on-chip lenses 256 are formed.

In step S2, the CMOS image sensor 230 in which the through silicon via 275 and the like formed in step S1 are not formed and the protective substrate 232 are connected in a cavityless structure. Specifically, the sealing resin 231 is formed by being applied or laminated with a thickness of 5 to 100 um on the on-chip lens 256 of the CMOS image sensor 230 on which the through silicon via 275 and the like formed in step S1 are not formed. Then, the protective substrate 232 is adhered to the CMOS image sensor 230 on which the through silicon via 275 and the like are not formed via the sealing resin 231.

In step S3, the CMOS image sensor 230 and the protective substrate 232 connected in the cavityless structure in step S2 are vertically inverted. In step S4, the support substrate 251 is thinned to, for example, about 100 um using a back grinding technique.

Figure 7:
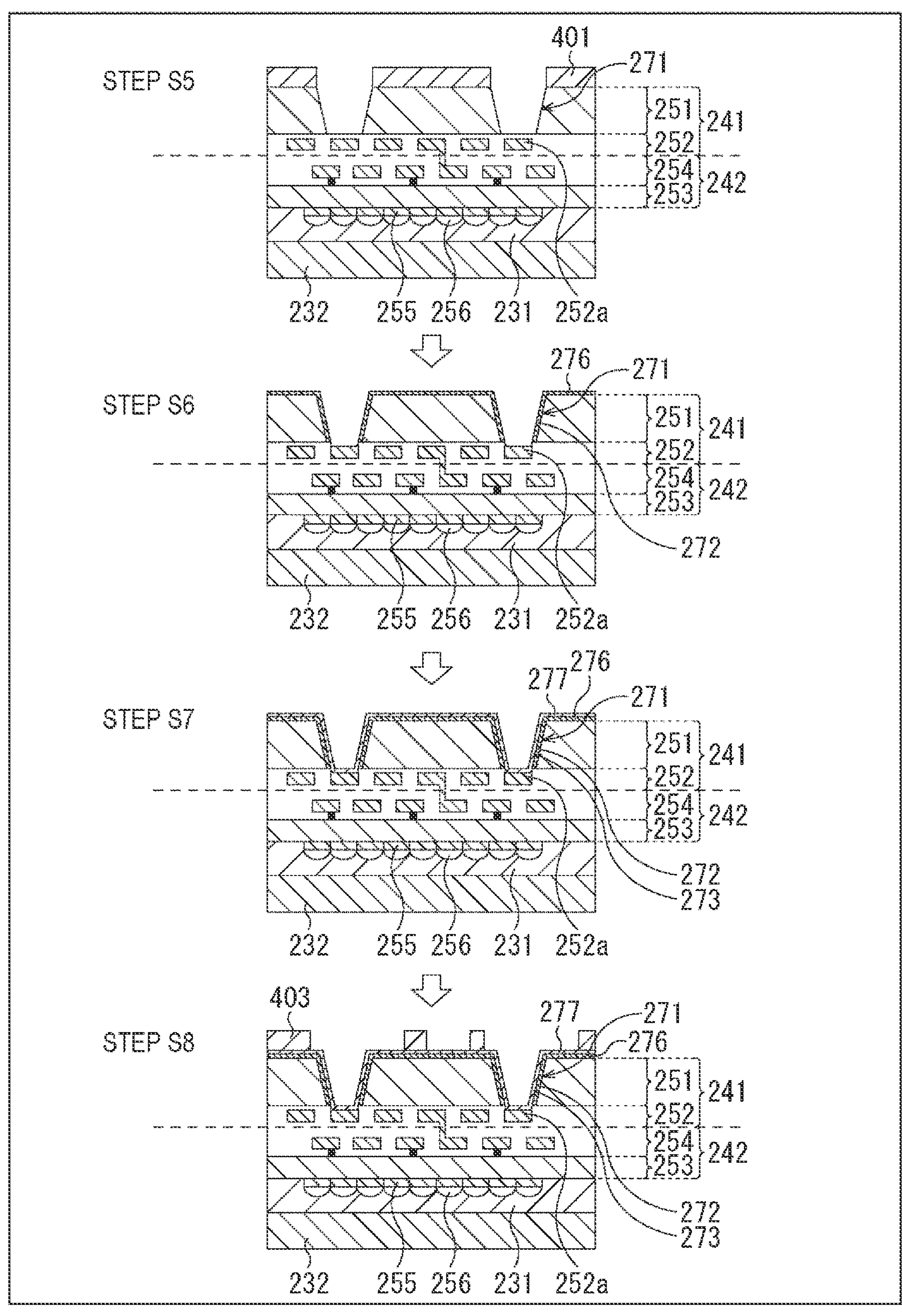
FIG. 7 is a diagram for explaining a method of manufacturing the semiconductor device in FIG. 1.

In step S5 of FIG. 7, in order to take out the electrode to the back surface of the CMOS image sensor 230, resist patterning of applying a resist 401 to a region other than the region corresponding to the connection pad 252*a* on the support substrate 251 is performed. Then, the support substrate 251 is penetrated using a dry etching method, and the through hole 271 is formed.

In step S6, a SiO2 film, a SiN film, or the like is formed as an insulating film (isolation film) on the entire surface including the through hole 271 on the support substrate 251 by, for example, a plasma chemical vapor deposition (CVD) method. Then, the insulating film on the bottom surface of the through hole 271 is removed by using an etch-back method, and the connection pad 252*a* formed in the region of the wiring layer 252 closest to the support substrate 251 is exposed. As a result, the insulating film 272 is formed on the through hole 271, and the insulating film 276 is formed on a region other than the through hole 271 of the support substrate 251.

In step S7, the barrier seed layer 273 is formed on the bottom surface of the through hole 271 and the insulating film 272 by a sputtering method, and the barrier seed layer 277 is formed on the insulating film 276. The barrier seed layer 273 and the barrier seed layer 277 include a barrier metal film for preventing diffusion of copper (Cu) to be plated in step S8 described later, and a Cu seed layer to be an electrode at the time of plating. In the present embodiment, titanium (Ti) is used as the material of the barrier metal film, but tungsten (W), a nitride film of titanium (Ti) or tungsten (W), an alloy of titanium (Ti) or tungsten (W), or the like can also be used as the material of the barrier metal film in addition to titanium.

In step S8, resist patterning is performed in which a resist 403 is applied to a region other than a region on the barrier seed layer 277 where the redistribution layer 278 is to be formed.

Figure 8:
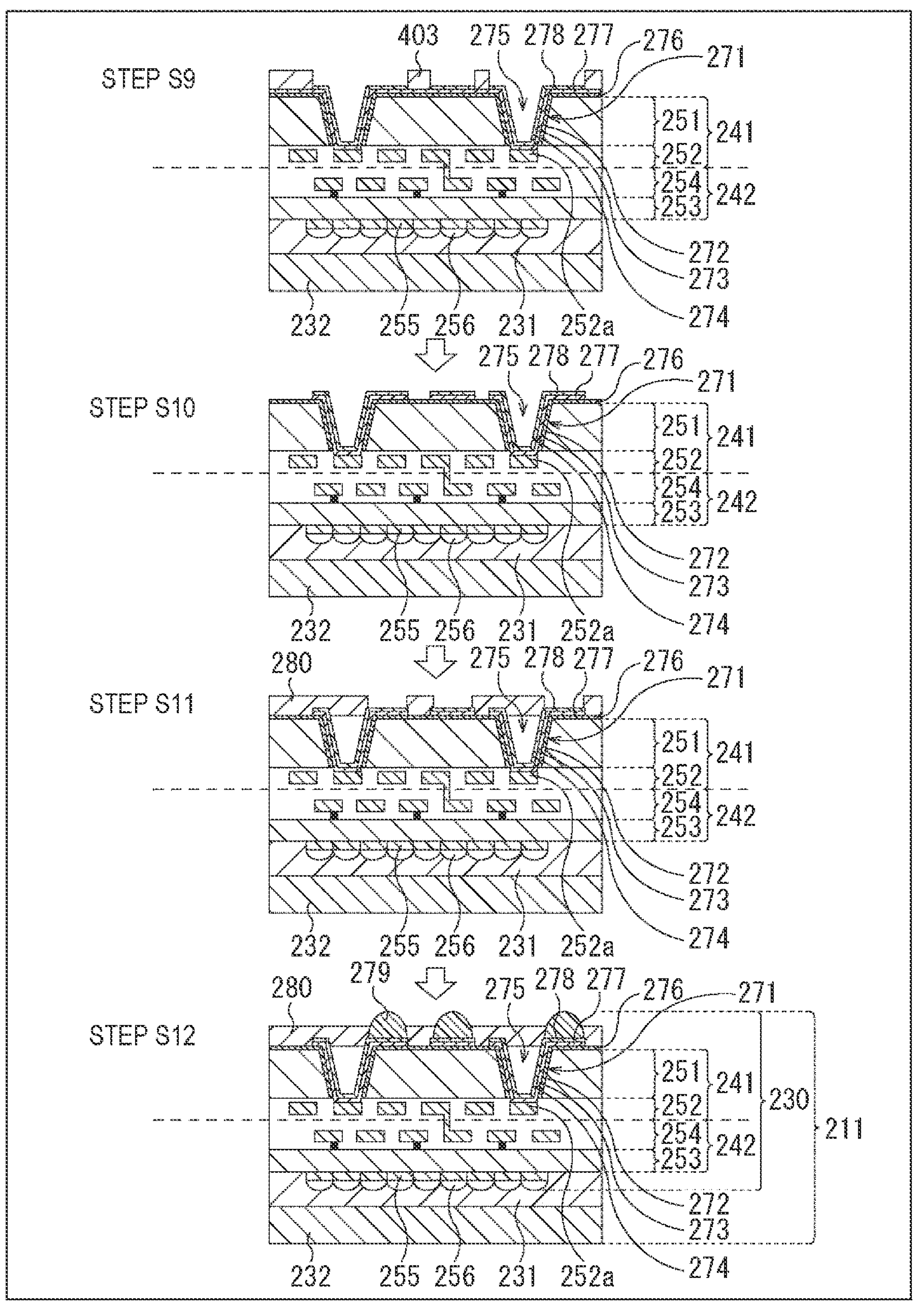
FIG. 8 is a diagram for explaining a method of manufacturing the semiconductor device in FIG. 1.

In step S9 of FIG. 8, copper (Cu) is plated on a region where the resist 403 is not applied by an electrolytic plating method. As a result, the connection conductor 274 is embedded in the inner wall of the through hole 271 via the insulating film 272 and the barrier seed layer 273, and as a result, the through silicon via 275 is formed. Further, on the lower surface side of the support substrate 251, the redistribution layer 278 connected to the connection conductor 274 is formed via the insulating film 276 and the barrier seed layer 277.

In step S10, the resist 403 is removed. Then, the barrier seed layer 277 under the resist 403 is removed by wet etching.

In step S11, a photosensitive solder resist is applied, exposed, and developed on the through silicon via 275, the insulating film 276, and the redistribution layer 278, and the photosensitive solder resist 280 is formed in a region other than a region where the solder ball 279 is to be formed.

In step S12, the solder ball 279 is mounted on a region where the photosensitive solder resist 280 is not formed in step S11 by using a ball swing method. The semiconductor chip 211 is formed as described above.

The above-described steps S1 to S12 may be performed in units of wafers or in units of singulated chips.

Figure 9:
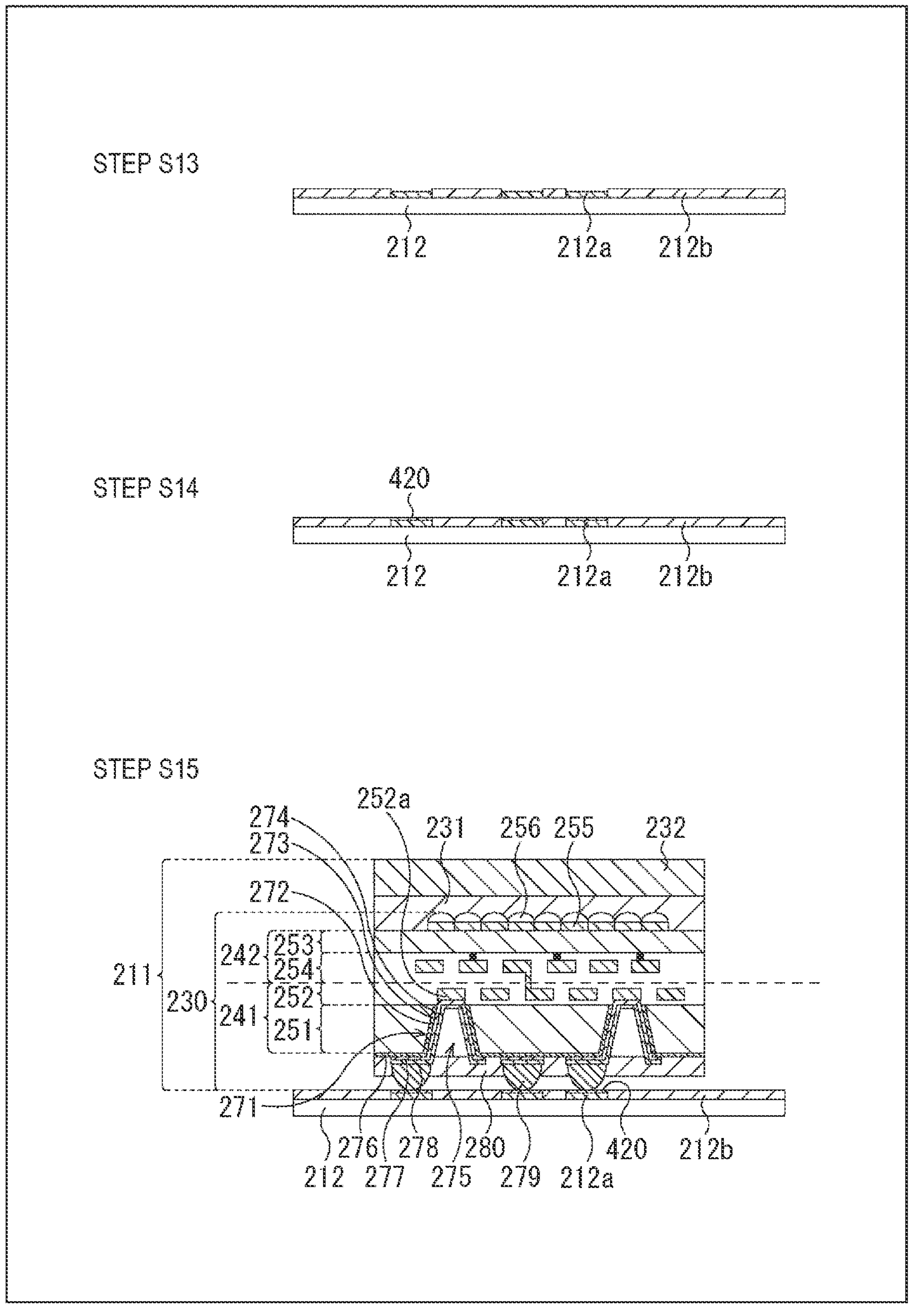
FIG. 9 is a diagram for explaining a method of manufacturing the semiconductor device in FIG. 1.

In step S13 in FIG. 9, the conductor 212*a* is formed at the position on the surface where the solder ball 279 is to be mounted, and the substrate 212 on which the photosensitive solder resist 212*b* is formed is formed in the other region. In step S14, the solder 420 is pre-coated on the conductor 212*a* of the substrate 212 by a solder paste printing method.

In step S15, the solder ball 279 of the semiconductor chip 211 is mounted on the conductor 212*a* via the solder 420.

Figure 10:
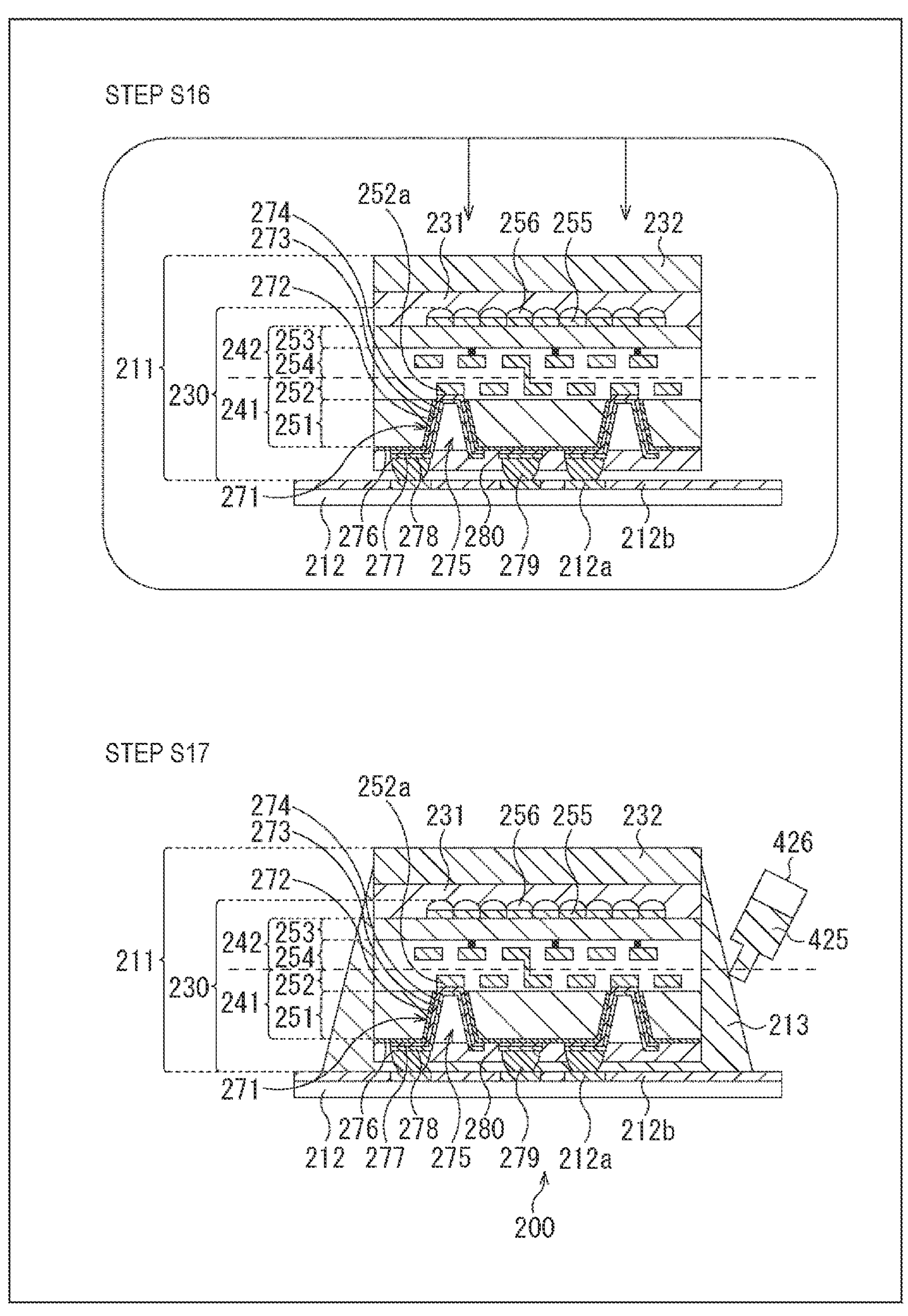
FIG. 10 is a diagram for explaining a method of manufacturing the semiconductor device in FIG. 1.

In step S16 in FIG. 10, reflow is performed on the substrate 212 on which the semiconductor chip 211 is mounted in a surface mount reflow furnace provided with a plurality of different temperature zones. As a result, the semiconductor chip 211 is soldered to the substrate 212 via the solder ball 279. Thereafter, the solder paste residue (flux residue) remaining between the semiconductor chip 211 and the substrate 212 is removed using a dedicated cleaning liquid. In a case where the solder flux is a rosin-based flux, an alcohol-based cleaning liquid is used as a dedicated cleaning liquid. As described above, the semiconductor chip 211 is secondarily mounted on the substrate 212.

In step S17, an epoxy-based thermosetting underfill material 425 is charged between the semiconductor chip 211 and the substrate 212. Specifically, the underfill material 425 is injected between the semiconductor chip 211 and the substrate 212 from the periphery of one side of the semiconductor chip 211 using a dispense nozzle 426. At this time, the protruding underfill material 425 crawls up on the side wall of the semiconductor chip 211, and a fillet is formed. The charged underfill material 425 is thermally cured, for example, at 150° C. for 5 minutes. As a result, the underfill material 213 is formed so as to cover the bottom surface and the side surface of the semiconductor chip 211.

Note that, in the present embodiment, only the semiconductor chip 211 is mounted on the substrate 212, but in addition to the semiconductor chip 211, an integrated circuit (IC) other than the semiconductor chip 211, a passive component, or the like (hereinafter, referred to as other components) can also be mounted. In this case, the other components are collectively soldered together with the semiconductor chip 211.

Specifically, a conductor is also formed on the surface of the substrate 212 at a position where other components are mounted, and the solder is also pre-coated on the conductor in step S14. Then, in step S15, the semiconductor chip 211 is mounted on the conductor 212*a* via the solder 420, and other components are mounted on the conductor other than the conductor 212*a* via the solder. In step S16, reflow is performed on the substrate 212 on which the semiconductor chip 211 and other components are mounted, and the semiconductor chip 211 and the other components are collectively soldered to the substrate 212.

As described above, in the semiconductor chip 211, the sealing resin 231 for bonding the CMOS image sensor 230 and the protective substrate 232 includes the base material 351 and the reinforcing material 352 having a higher Young's modulus or breaking strength than the base material 351.

Therefore, the strength of the sealing resin 231 can be improved as compared with the sealing resin 301 or the like not containing the reinforcing material 352. As a result, it is possible to improve the crack resistance of the sealing resin 231 against stress such as curing shrinkage stress generated when the underfill material 213 is thermally cured. In addition, even in a case where the crack 371 is generated by the cohesive fracture, the crack 371 can be stopped at the interface of the reinforcing material 352. Therefore, it is possible to prevent the crack 371 from developing on the light receiving region. As a result, in the semiconductor device 200, the semiconductor chip 211 is protected by the underfill material 213, and it is possible to suppress image quality deterioration of a captured image due to whitening of the sealing resin 231 while securing long-term reliability after the semiconductor chip 211 is mounted on the substrate 212.

Note that, in the CMOS image sensor 230, the solder ball 279 is formed, but the solder ball 279 may not be formed.

2. Second Embodiment of Semiconductor Device

First Example of Package Structure of Semiconductor Device

Figure 11:
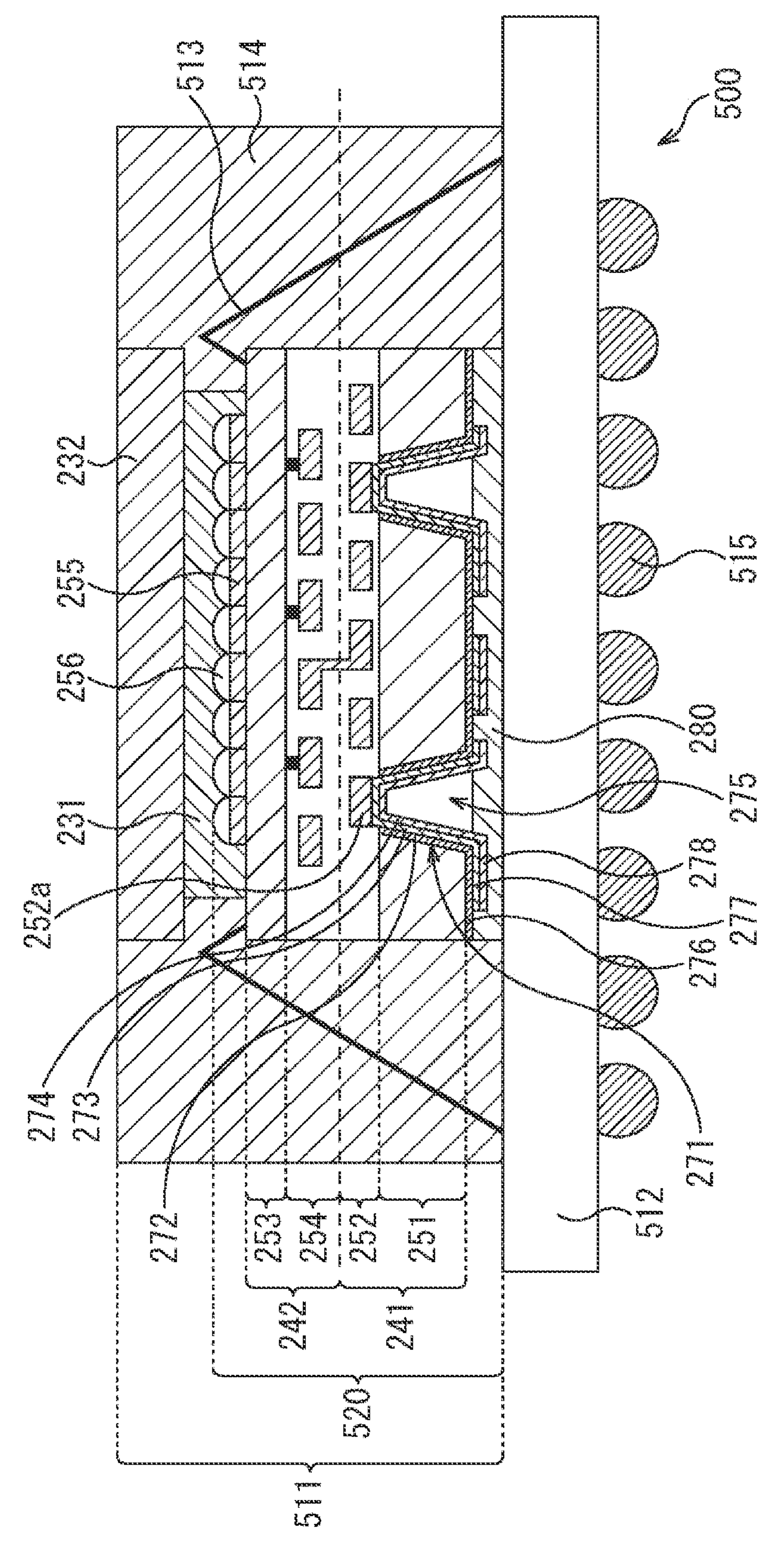
FIG. 11 is a diagram illustrating a first example of a package structure of a second embodiment of a semiconductor device to which the present technology is applied.

FIG. 11 is a diagram illustrating a first example of a package structure of a second embodiment of a semiconductor device to which the present technology is applied.

In a semiconductor device 500 of FIG. 11, portions corresponding to those of the semiconductor device 200 of FIG. 1 are denoted by the same reference numerals. Therefore, description of the portions will be appropriately omitted, and description will be given focusing on portions different from the semiconductor device 200 in FIG. 1.

In the semiconductor device 500 of FIG. 11, the semiconductor chip 211 of FIG. 1 is not solder-connected to the substrate 212 but wire-bonded. Specifically, in the semiconductor device 500, a semiconductor chip 511 is mounted by being connected to a relay substrate 512 via a wire 513.

The semiconductor chip 511 is different from the semiconductor chip 211 in that a CMOS image sensor 520 is provided instead of the CMOS image sensor 230, an outer periphery of a sealing resin 231 is smaller than an outer periphery of the CMOS image sensor 230, and the wire 513 is provided, and other configurations are similar to those of the semiconductor chip 211.

The CMOS image sensor 520 is different from the CMOS image sensor 230 in that the solder ball 279 is not formed, and is configured similarly to the CMOS image sensor 230 except for this point. The wire 513 is formed in a region on the silicon substrate 253 where the sealing resin 231 is not formed, and electrically connects the silicon substrate 253 and the relay substrate 512.

In addition, in the semiconductor device 500, the wire 513 is embedded in the resin 514. That is, the resin 514 is formed on the relay substrate 512 so as to cover the wire 513 on the side surface of the semiconductor chip 511. On the lower side of the relay substrate 512, a solder ball 515 is formed for mounting on a mounting substrate (not illustrated).

As described above, the semiconductor device 500 is a BGA package having an organic package structure in which the semiconductor chip 511 is wire-bonded to the relay substrate 512 using the wire 513, and the wire 513 is embedded with the resin 514.

In the semiconductor device 500, similarly to the case of the semiconductor device 200, since the sealing resin 231 contains the reinforcing material 352, the sealing resin 514 has high crack resistance against stress such as curing shrinkage stress generated when the resin 231 is thermally cured. In addition, even in a case where the crack 371 is generated by the cohesive fracture, it is possible to prevent the crack 371 from developing on the light receiving region. As a result, in the semiconductor device 500, it is possible to suppress image quality deterioration of a captured image due to whitening of the sealing resin 231 while securing long-term reliability after the semiconductor chip 511 is protected by the resin 514 and the semiconductor chip 511 is mounted on the relay substrate 512.

Second Example of Package Structure of Semiconductor Device

Figure 12:
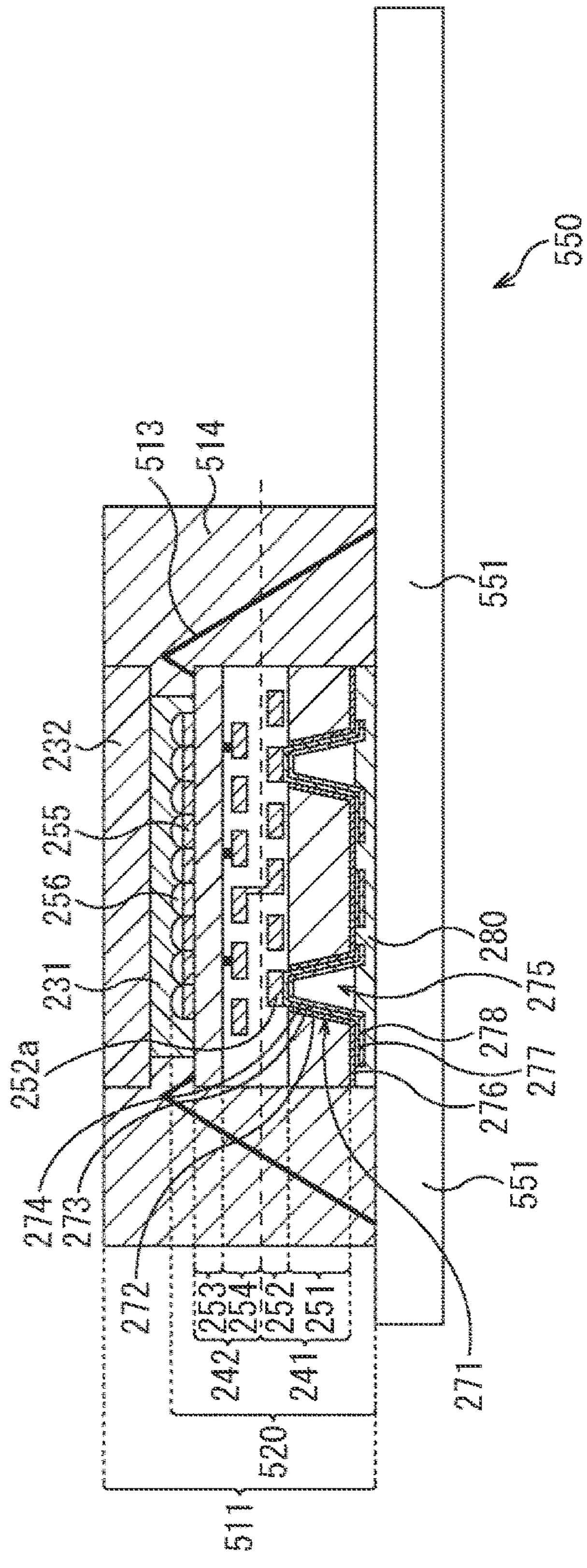
FIG. 12 is a diagram illustrating a second example of a package structure of a second embodiment of a semiconductor device to which the present technology is applied.

FIG. 12 is a diagram illustrating a second example of a package structure of a second embodiment of a semiconductor device to which the present technology is applied.

In a semiconductor device 550 of FIG. 12, portions corresponding to those of the semiconductor device 500 of FIG. 11 are denoted by the same reference numerals. Therefore, description of the portions will be appropriately omitted, and description will be given focusing on portions different from the semiconductor device 500 in FIG. 11.

The semiconductor device 550 in FIG. 12 is different from the semiconductor device 500 in that a mounting substrate 551 is provided instead of the relay substrate 512 and the solder ball 515 is not formed, and other configurations are similar to those of the semiconductor device 500.

That is, in the semiconductor device 550, the semiconductor chip 511 is wire-bonded to the mounting substrate 551 using the wire 513, and the semiconductor chip 511 is directly mounted on the mounting substrate 551.

In the semiconductor device 550, similarly to the semiconductor device 500, the sealing resin 231 includes the reinforcing material 352. Therefore, it is possible to suppress image quality deterioration of a captured image due to whitening of the sealing resin 231 while securing long-term reliability after the semiconductor chip 511 is protected by the resin 514 and the semiconductor chip 511 is mounted on the mounting substrate 551.

Note that the CMOS image sensor 230 or 520 is a stacked back-illuminated CMOS image sensor, but may be a front-illuminated or back-illuminated CMOS image sensor.

Furthermore, in the CMOS image sensor 230 or 520, the control circuit and the logic circuit are formed on the lower substrate 241, and the pixel region is formed on the upper substrate 242. However, only the logic circuit may be formed on the lower substrate 241, and the pixel region and the control circuit may be formed on the upper substrate 242.

3. Application Example to Electronic Device

The semiconductor chip 211 or 511 described above can be applied to various electronic devices such as an imaging device such as a digital still camera or a digital video camera, a mobile phone having an imaging function, or another device having an imaging function, for example.

Figure 13:
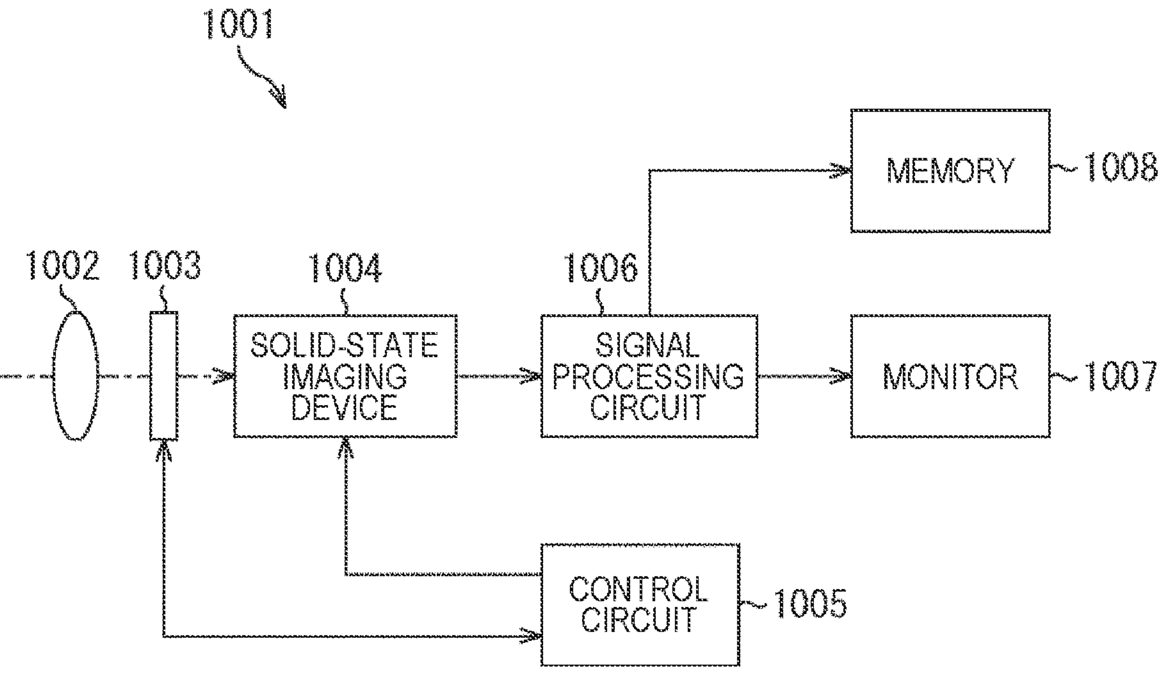
FIG. 13 is a block diagram depicting a configuration example of an imaging device as an electronic device to which the technology of the present disclosure is applied.

FIG. 13 is a block diagram illustrating a configuration example of an imaging device as an electronic device to which the present technology is applied.

An imaging device 1001 illustrated in FIG. 13 provided with an optical system 1002, a shutter device 1003, a solid-state imaging device 1004, a drive circuit 1005, a signal processing circuit 1006, a monitor 1007, and a memory 1008 may image a still image and a moving image.

The optical system 1002 includes one or a plurality of lenses, guides light (incident light) from a subject to the solid-state imaging device 1004, and forms an image on a light receiving surface of the solid-state imaging device 1004.

The shutter device 1003 is arranged between the optical system 1002 and the solid-state imaging device 1004, and controls a light irradiation period and a light shielding period with respect to the solid-state imaging device 1004 according to the control of the drive circuit 1005.

The solid-state imaging device 1004 includes the semiconductor chip 211 or 511 described above. The solid-state imaging device 1004 accumulates signal charges for a certain period according to light formed on the light receiving surface via the optical system 1002 and the shutter device 1003. The signal charges accumulated in the solid-state imaging device 1004 are transferred in accordance with a drive signal (timing signal) supplied from the drive circuit 1005.

The drive circuit 1005 outputs a drive signal for controlling a transfer operation of the solid-state imaging device 1004 and a shutter operation of the shutter device 1003 to drive the solid-state imaging device 1004 and the shutter device 1003.

The signal processing circuit 1006 performs various types of signal processing on the signal charge output from the solid-state imaging device 1004. The image (image data) obtained by the signal processing applied by the signal processing circuit 1006 is supplied to the monitor 1007 to be displayed or supplied to the memory 1008 to be stored (recorded).

Also in the imaging device 1001 configured as described above, by applying the semiconductor chip 211 (511) as the solid-state imaging device 1004, it is possible to suppress image quality deterioration of a captured image while securing long-term reliability after mounting on the substrate 212 (relay substrate 512 and mounting substrate 551).

4. Use Example of Semiconductor Chip

Figure 14:
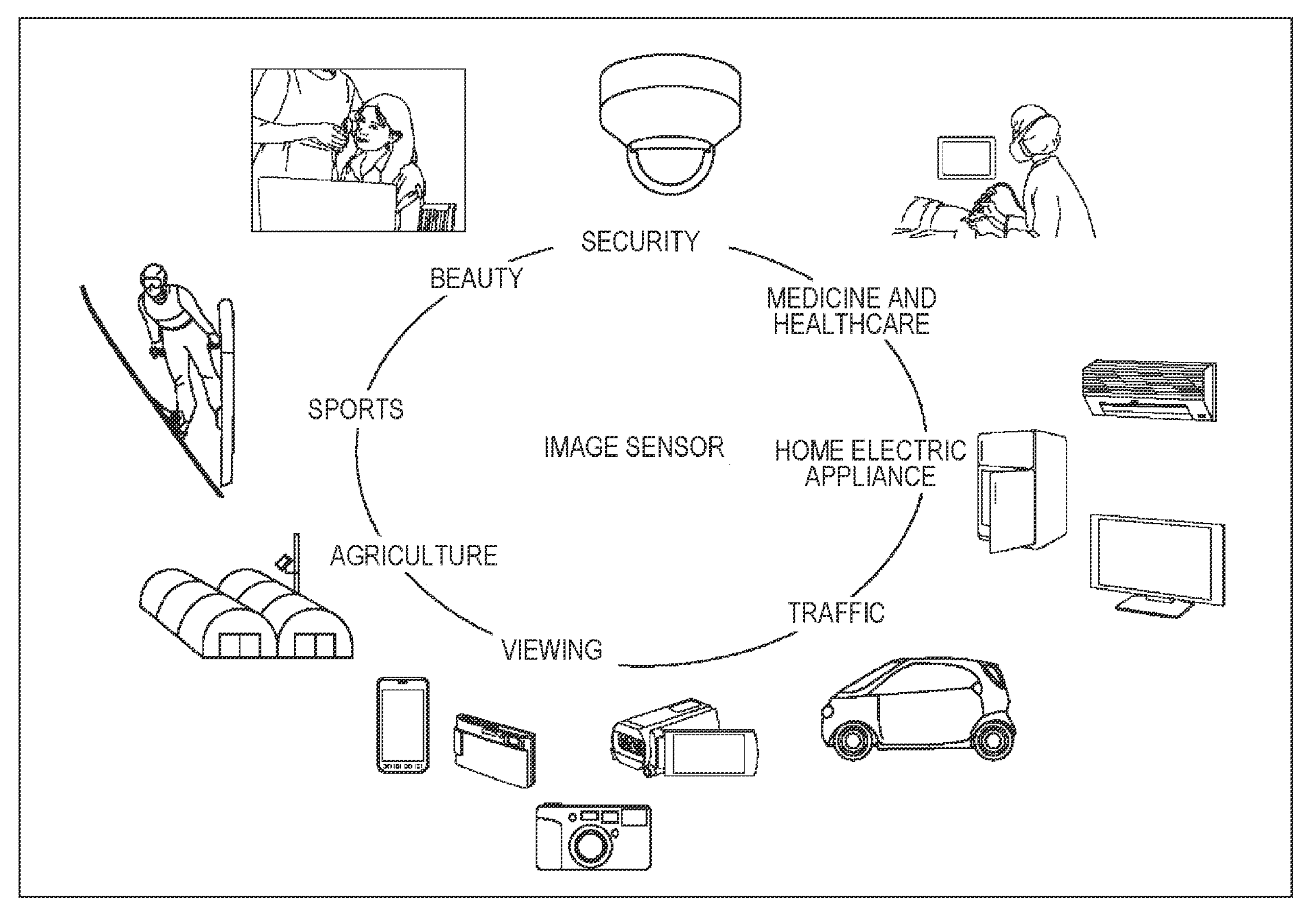
FIG. 14 is a diagram illustrating a use example using a semiconductor chip.

FIG. 14 is a diagram illustrating a use example using the above-described semiconductor chip 211 or 511.

The semiconductor chip 211 or 511 described above can be used, for example, in various cases of sensing light such as visible light, infrared light, ultraviolet light, and X-rays as described below.

- A device that captures an image to be used for viewing such as a digital camera and a portable device with a camera function
- A device used for traffic, such as an in-vehicle sensor that captures images of the front, rear, surroundings, interior, and the like of an automobile for safe driving such as automatic stop, recognition of a condition of a driver, and the like, a monitoring camera that monitors traveling vehicles and roads, a distance measuring sensor that measures a distance between vehicles, and the like
- A device used for home electric appliances such as a television, a refrigerator, and an air conditioner in order to capture an image of a gesture of a user and perform device operation according to the gesture
- A device for medical and healthcare use such as an endoscope and a device that performs angiography by receiving infrared light
- A device for security use such as a security monitoring camera and an individual authentication camera
- A device for beauty care such as a skin condition measuring instrument that captures images of skin and a microscope that captures images of scalp
- A device for sports use such as an action camera and a wearable camera for sports applications and the like
- A device for agricultural use such as a camera for monitoring conditions of fields or crops.

5. Application Example to Endoscopic Surgery System

The technology according to the present disclosure (present technology) can be applied to various products. For example, the technology according to the present disclosure may be applied to an endoscopic surgery system.

Figure 15:
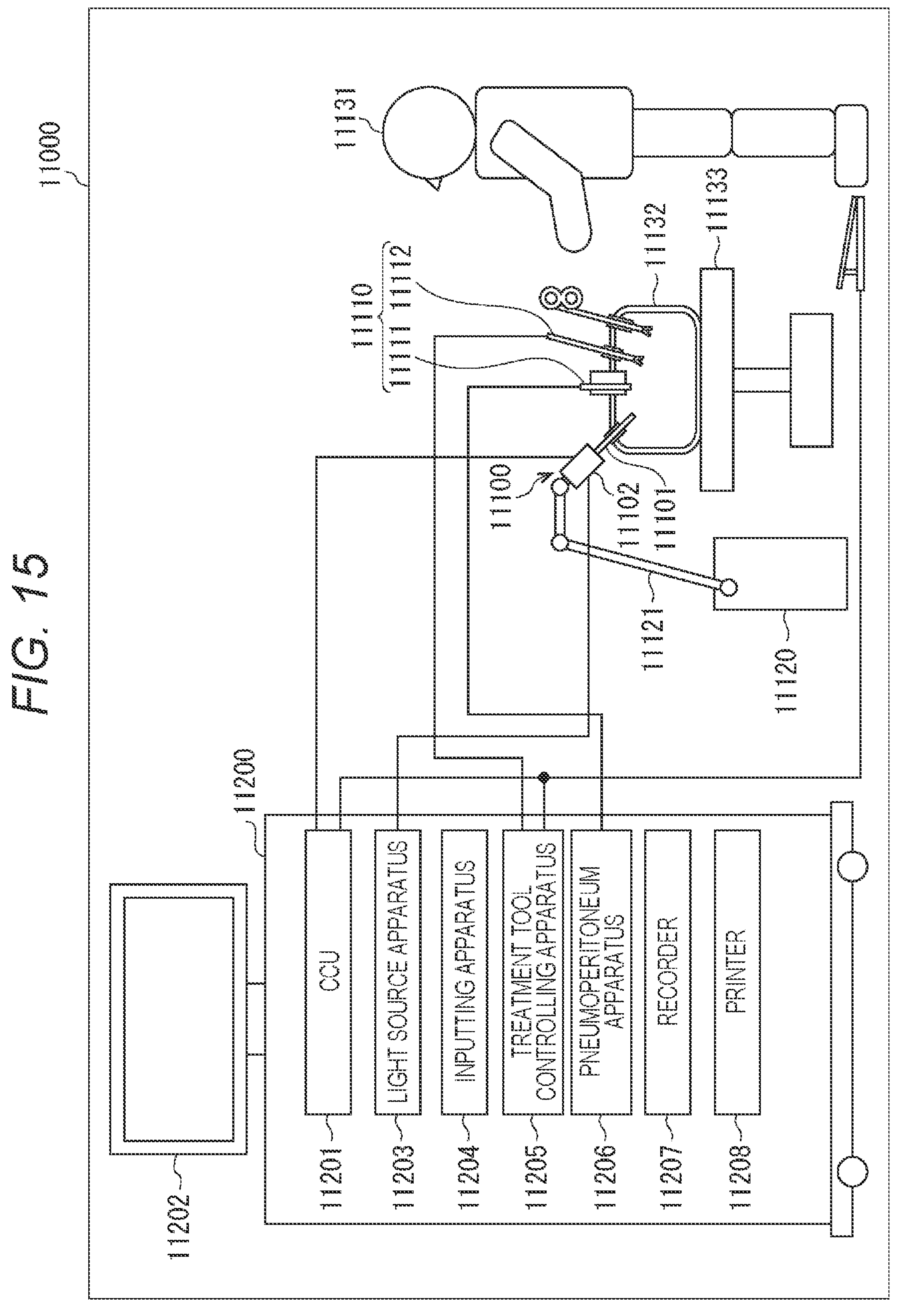
FIG. 15 is a view depicting an example of a schematic configuration of an endoscopic surgery system.

FIG. 15 is a view depicting an example of a schematic configuration of an endoscopic surgery system to which the technology according to the present disclosure (present technology) can be applied.

In FIG. 15, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 16:
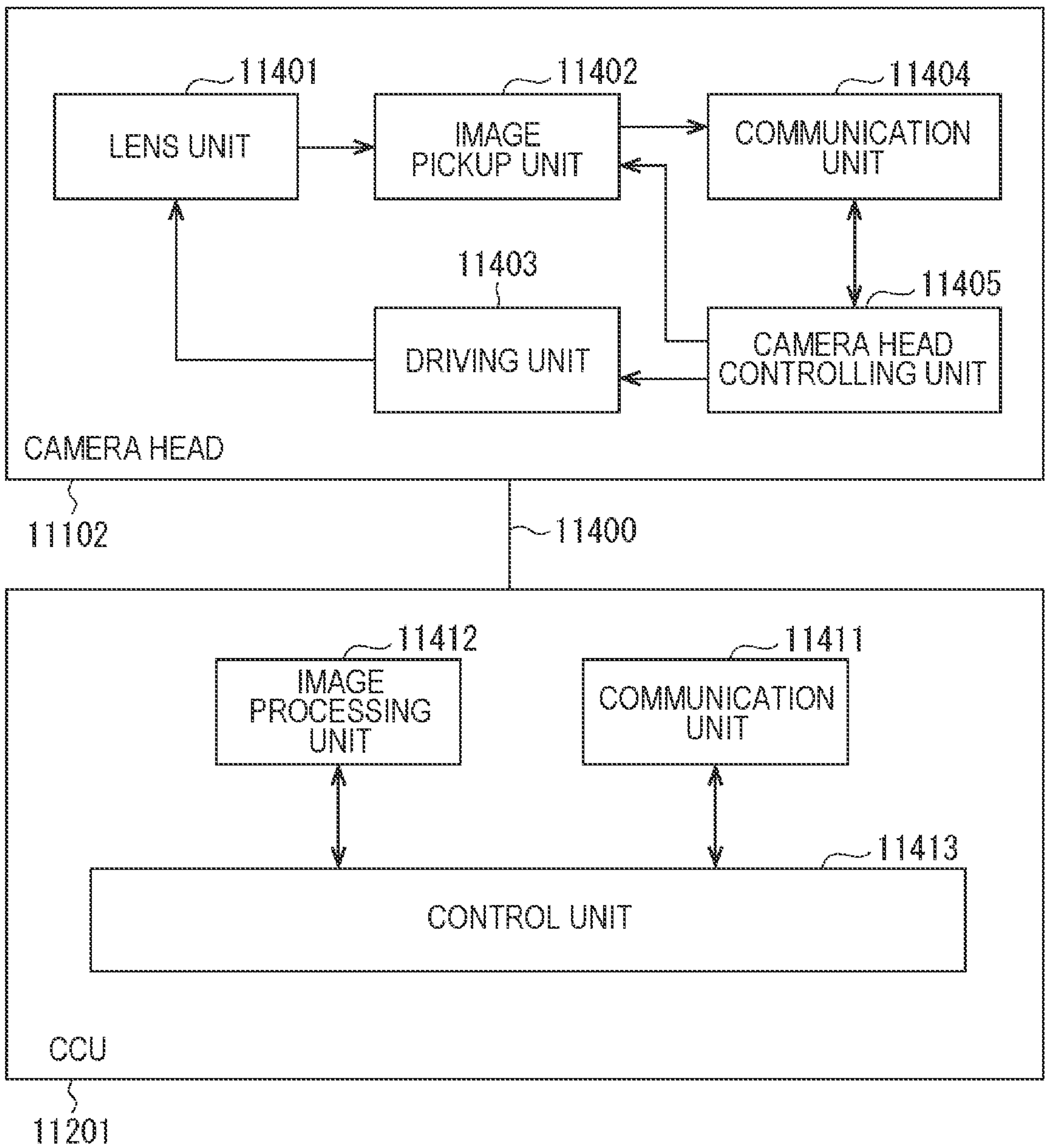
FIG. 16 is a block diagram depicting an example of a functional configuration of a camera head and a camera control unit (CCU).

FIG. 16 is a block diagram depicting an example of a functional configuration of the camera head 11102 and the CCU 11201 depicted in FIG. 15.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The image pickup unit 11402 includes an image pickup element. The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. Alternatively, the image pickup unit 11402 may also be configured so as to have a pair of image pickup elements for respectively acquiring image signals for the right eye and the left eye applicable for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

An example of the endoscopic surgery system to which the technology according to the technology according to the present disclosure can be applied has been described above. The technology according to the present disclosure may be applied to the image pickup unit 11402 among the configurations described above. Specifically, the semiconductor chip 211 or 511 can be applied to the image pickup unit 11402. By applying the technology according to the present disclosure to the image pickup unit 11402, it is possible to obtain a clearer surgical region image while securing long-term reliability of the image pickup unit 11402.

Note that, here, the endoscopic surgery system has been described as an example, but the technology according to the present disclosure may be applied to, for example, a microscopic surgery system or the like.

6. Application Example to Moving Body

The technology according to the present disclosure (present technology) can be applied to various products. For example, the technology according to the present disclosure may be implemented as a device mounted on any type of moving body such as an automobile, an electric vehicle, a hybrid electric vehicle, a motorcycle, a bicycle, a personal mobility, an airplane, a drone, a ship, a robot, and the like.

Figure 17:
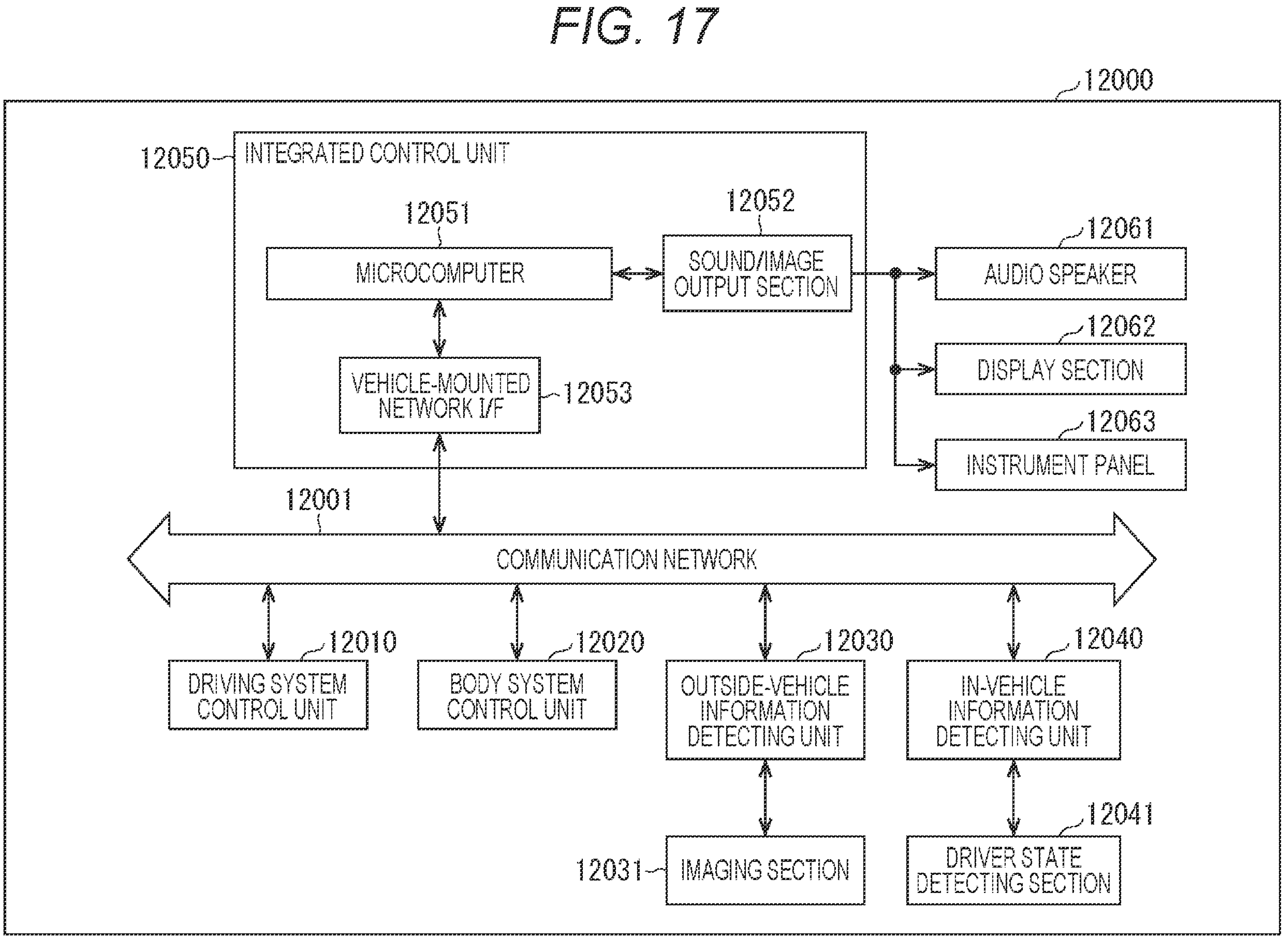
FIG. 17 is a block diagram depicting an example of schematic configuration of a vehicle control system.

FIG. 17 is a block diagram depicting a schematic configuration example of a vehicle control system as an example of a moving body control system to which the technology according to the present disclosure can be applied.

The vehicle control system 12000 includes a plurality of electronic control units connected to each other via a communication network 12001. In the example depicted in FIG. 17, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

Furthermore, the microcomputer 12051 can output a control command to the body system control unit 12020 on the basis of the information about the outside of the vehicle obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 17, an audio speaker 12061, a display section 12062, and an instrument panel 12063 are illustrated as the output device. The display section 12062 may, for example, include at least one of an on-board display and a head-up display.

Figure 18:
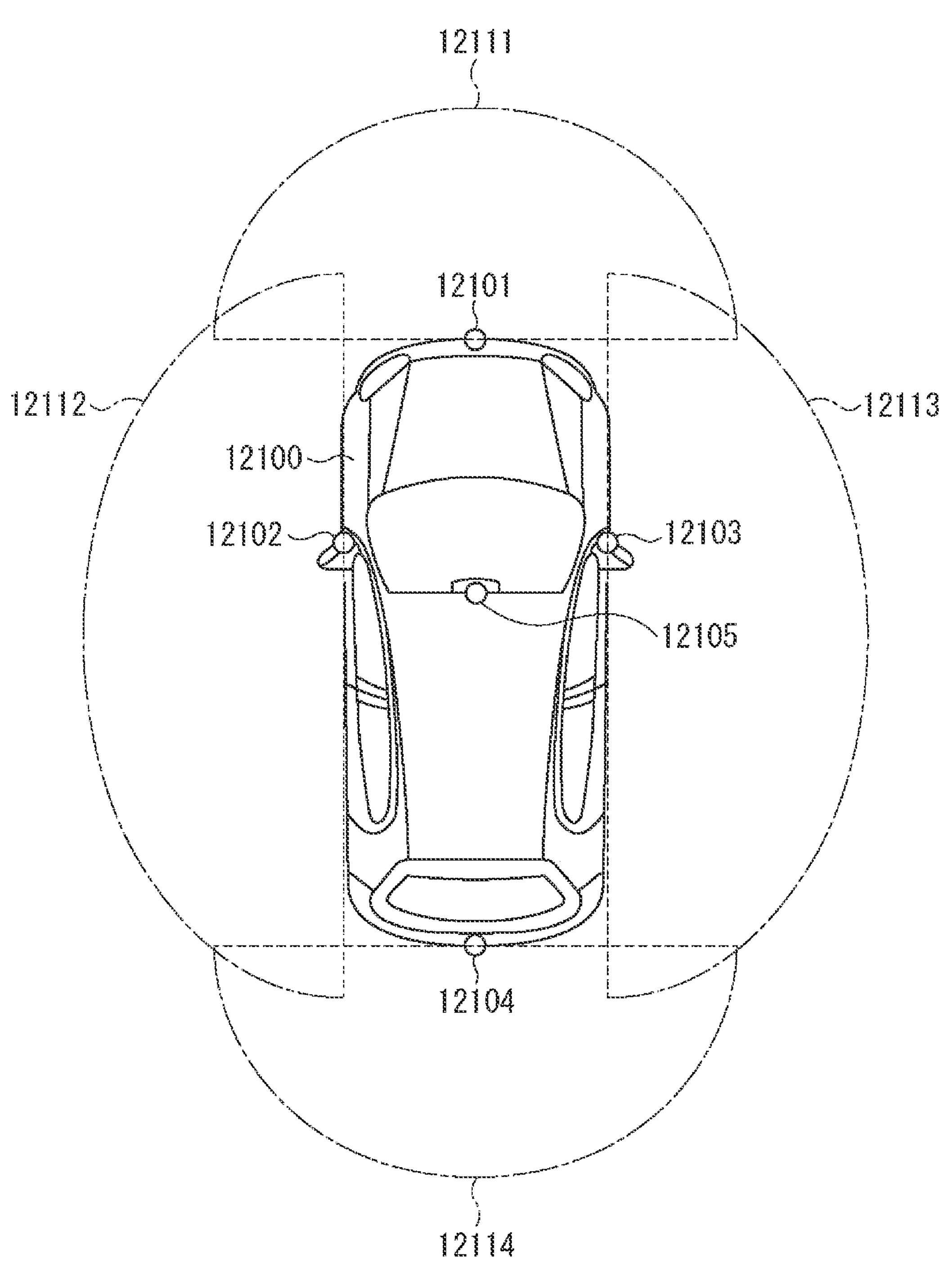
FIG. 18 is an explanatory diagram illustrating an example of installation positions of an outside-vehicle information detecting section and an imaging section.

FIG. 18 is a diagram depicting an example of the installation position of the imaging section 12031.

In FIG. 18, the vehicle 12100 includes imaging sections 12101, 12102, 12103, 12104, and 12105 as the imaging section 12031.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within an interior of the vehicle, and the like. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The images of the front obtained by the imaging sections 12101 and 12105 are used mainly to detect a preceding vehicle, a pedestrian, an obstacle, a signal, a traffic sign, a lane, or the like.

Incidentally, FIG. 18 depicts an example of imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure can be applied has been described above. The technology according to the present disclosure can be applied to the imaging section 12031 and the like in the configuration described above. Specifically, the semiconductor chip 211 or 511 can be applied to the imaging section 12031. By applying the technology according to the present disclosure to the imaging section 12031, it is possible to obtain a more easily viewable captured image while securing the long-term reliability of the imaging section 12031.

The embodiments of the present technology are not limited to the above-described embodiments, and various modifications can be made without departing from the gist of the present technology.

For example, a form in which all or some of the plurality of embodiments described above are combined can be adopted.

Note that the effects described in the present specification are merely examples and are not limited, and effects other than those described in the present description may be provided.

Note that the present technology can have the following configurations.

(1)

A semiconductor chip including:

an imaging element;

a sealing resin formed on the imaging element; and a protective substrate bonded to the imaging element via the sealing resin, in which the sealing resin includes a base material and a reinforcing material having a Young's modulus or breaking strength higher than that of the base material.

(2)

The semiconductor chip according to (1), in which the reinforcing material is fibrous.

(3)

The semiconductor chip according to (2), in which, in the reinforcing material, a diameter of a cross section of a short side is shorter than a wavelength of visible light, and a diameter of a cross section of a long side is three times or more a cross-sectional diameter of the short side.

(4)

The semiconductor chip according to (2) or (3), in which the reinforcing material is glass fiber or organic fiber.

(5)

The semiconductor chip according to (4), in which the organic fiber is a cellulose nanofiber or a nanoparticle aggregate in which nanoparticles are aggregated.

(6)

The semiconductor chip according to any one of (1) to (5), in which the reinforcing material transmits visible light.

(7)

The semiconductor chip according to any one of (1) to (6), in which a content of the reinforcing material is 2 to 50 wt %.

(8)

The semiconductor chip according to any one of (1) to (7), in which a refractive index of the base material is substantially equal to a refractive index of the protective substrate.

(9)

The semiconductor chip according to any one of (1) to (8), in which a refractive index of the reinforcing material is substantially equal to a refractive index of the base material.

(10)

The semiconductor chip according to (9), in which a difference in refractive index between the reinforcing material and the base material is 0.06 or less.

(11)

The semiconductor chip according to any one of (1) to (9), in which a difference in refractive index between the reinforcing material and the base material is 0.03 or more.

(12)

The semiconductor chip according to (11), in which a difference in refractive index between the reinforcing material and the base material is 0.03 or more and 0.06 or less.

(13)

The semiconductor chip according to (1) to (12), in which the imaging element includes an on-chip lens, and the sealing resin is formed on the on-chip lens and has a refractive index lower than that of the on-chip lens.

(14)

A method of manufacturing a semiconductor chip, the method including:

forming an imaging element;

forming a sealing resin including a base material and a reinforcing material having a Young's modulus or breaking strength higher than that of the base material on the imaging element; and bonding a protective substrate to the imaging element via the sealing resin.

(15)

A semiconductor device including:

a semiconductor chip including:

an imaging element;

a sealing resin formed on the imaging element; and a protective substrate bonded to the imaging element via the sealing resin, the sealing resin including a base material and a reinforcing material having a Young's modulus or breaking strength higher than that of the base material;

a substrate on which the semiconductor chip is mounted; and an underfill material formed on the substrate to cover a side surface of the semiconductor chip.

(16)

A method of manufacturing a semiconductor device, the method including:

forming a semiconductor chip by:

forming an imaging element;

forming a sealing resin including a base material and a reinforcing material having a Young's modulus or breaking strength higher than that of the base material on the imaging element; and bonding a protective substrate to the imaging element via the sealing resin;

mounting the semiconductor chip on a substrate; and charging an underfill material from a periphery of the semiconductor chip between the semiconductor chip and the substrate and thermally curing the underfill material, and covering a side surface of the semiconductor chip with the underfill material.

(17)

A semiconductor device including:

a semiconductor chip including:

an imaging element;

a sealing resin formed on the imaging element; and a protective substrate bonded to the imaging element via the sealing resin, the sealing resin including a base material and a reinforcing material having a Young's modulus or breaking strength higher than that of the base material;

a substrate on which the semiconductor chip is mounted using a wire; and a resin formed on the substrate to cover the wire on a side surface of the semiconductor chip.

(18)

An electronic device including:

a semiconductor chip including:

an imaging element;

a sealing resin formed on the imaging element; and a protective substrate bonded to the imaging element via the sealing resin, the sealing resin including a base material and a reinforcing material having a Young's modulus or breaking strength higher than that of the base material; and a signal processing circuit that processes a signal from the semiconductor chip.

REFERENCE SIGNS LIST

200 Semiconductor device
211 Semiconductor chip
212 Substrate
213 Underfill material
230 CMOS image sensor
231 Sealing resin
232 Protective substrate
256 On-chip lens
351 Base material
352 Reinforcing material
500 Semiconductor device
511 Semiconductor chip
512 Relay substrate
513 Wire
514 Resin
520 CMOS image sensor
550 Semiconductor device
551 Mounting substrate
1001 Imaging device
1006 Signal processing circuit

The invention claimed is:

1. A semiconductor chip, comprising:

an imaging element;

a sealing resin formed on the imaging element; and a protective substrate bonded to the imaging element via the sealing resin, wherein the sealing resin includes a base material and a reinforcing material having a Young's modulus or breaking strength higher than that of the base material, wherein the reinforcing material is fibrous, and wherein, in the reinforcing material, a diameter of a cross section of a short side is shorter than a wavelength of visible light, and a diameter of a cross section of a long side is three times or more a cross-sectional diameter of the short side.

2. The semiconductor chip according to claim 1, wherein the reinforcing material is glass fiber or organic fiber.

3. The semiconductor chip according to claim 2, wherein the organic fiber is a cellulose nanofiber or a nanoparticle aggregate in which nanoparticles are aggregated.

4. The semiconductor chip according to claim 1, wherein the reinforcing material transmits visible light.

5. The semiconductor chip according to claim 1, wherein a content of the reinforcing material is 2 to 50 wt %.

6. The semiconductor chip according to claim 1, wherein a refractive index of the base material is substantially equal to a refractive index of the protective substrate.

7. The semiconductor chip according to claim 1, wherein a refractive index of the reinforcing material is substantially equal to a refractive index of the base material.

8. The semiconductor chip according to claim 7, wherein a difference in refractive index between the reinforcing material and the base material is 0.06 or less.

9. The semiconductor chip according to claim 1, wherein a difference in refractive index between the reinforcing material and the base material is 0.03 or more.

10. The semiconductor chip according to claim 9, wherein a difference in refractive index between the reinforcing material and the base material is 0.03 or more and 0.06 or less.

11. The semiconductor chip according to claim 1, wherein the imaging element includes an on-chip lens, and the sealing resin is formed on the on-chip lens and has a refractive index lower than that of the on-chip lens.

12. A method of manufacturing a semiconductor chip, the method comprising:

forming an imaging element;

forming a sealing resin including a base material and a reinforcing material having a Young's modulus or breaking strength higher than that of the base material on the imaging element, wherein the reinforcing material is fibrous, and wherein, in the reinforcing material, a diameter of a cross section of a short side is shorter than a wavelength of visible light, and a diameter of a cross section of a long side is three times or more a cross-sectional diameter of the short side; and bonding a protective substrate to the imaging element via the sealing resin.

13. The method of manufacturing a semiconductor chip according to claim 12, wherein the reinforcing material is glass fiber or organic fiber.

14. The method of manufacturing a semiconductor chip according to claim 13, wherein the organic fiber is a cellulose nanofiber or a nanoparticle aggregate in which nanoparticles are aggregated.

15. The method of manufacturing a semiconductor chip according to claim 12, wherein the reinforcing material transmits visible light.

16. The method of manufacturing a semiconductor chip according to claim 12, wherein a content of the reinforcing material is 2 to 50 wt %.

17. A semiconductor device, comprising:

a semiconductor chip including:

an imaging element;

a sealing resin formed on the imaging element; and a protective substrate bonded to the imaging element via the sealing resin, the sealing resin including a base material and a reinforcing material having a Young's modulus or breaking strength higher than that of the base material, wherein the reinforcing material is fibrous, and wherein, in the reinforcing material, a diameter of a cross section of a short side is shorter than a wavelength of visible light, and a diameter of a cross section of a long side is three times or more a cross-sectional diameter of the short side;

a substrate on which the semiconductor chip is mounted; and an underfill material formed on the substrate to cover a side surface of the semiconductor chip.

18. A method of manufacturing a semiconductor device, the method comprising:

forming a semiconductor chip by:

forming an imaging element;

forming a sealing resin including a base material and a reinforcing material having a Young's modulus or breaking strength higher than that of the base material on the imaging element, wherein the reinforcing material is fibrous, and wherein, in the reinforcing material, a diameter of a cross section of a short side is shorter than a wavelength of visible light, and a diameter of a cross section of a long side is three times or more a cross-sectional diameter of the short side; and bonding a protective substrate to the imaging element via the sealing resin;

mounting the semiconductor chip on a substrate; and charging an underfill material from a periphery of the semiconductor chip between the semiconductor chip and the substrate and thermally curing the underfill material, and covering a side surface of the semiconductor chip with the underfill material.

19. A semiconductor device, comprising:

a semiconductor chip including:

an imaging element;

a sealing resin formed on the imaging element; and a protective substrate bonded to the imaging element via the sealing resin, the sealing resin including a base material and a reinforcing material having a Young's modulus or breaking strength higher than that of the base material, wherein the reinforcing material is fibrous, and wherein, in the reinforcing material, a diameter of a cross section of a short side is shorter than a wavelength of visible light, and a diameter of a cross section of a long side is three times or more a cross-sectional diameter of the short side;

a substrate on which the semiconductor chip is mounted using a wire; and a resin formed on the substrate to cover the wire on a side surface of the semiconductor chip.

20. An electronic device, comprising:

a semiconductor chip including:

an imaging element;

a sealing resin formed on the imaging element; and a protective substrate bonded to the imaging element via the sealing resin, the sealing resin including a base material and a reinforcing material having a Young's modulus or breaking strength higher than that of the base material, wherein the reinforcing material is fibrous, and wherein, in the reinforcing material, a diameter of a cross section of a short side is shorter than a wavelength of visible light, and a diameter of a cross section of a long side is three times or more a cross-sectional diameter of the short side; and a signal processing circuit that processes a signal from the semiconductor chip.

* * * * *